US007052821B2

(12) United States Patent
Kohl et al.

(10) Patent No.: US 7,052,821 B2
(45) Date of Patent: *May 30, 2006

(54) SACRIFICIAL COMPOSITIONS, METHODS OF USE THEREOF, AND METHODS OF DECOMPOSITION THEREOF

(75) Inventors: Paul A. Kohl, Atlanta, GA (US); Paul Jayachandran Joseph, Atlanta, GA (US); Hollie Reed, Mableton, GA (US); Sue Bidstrup-Allen, Atlanta, GA (US); Celesta E. White, Katy, TX (US); Clifford Henderson, Douglasville, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/699,330

(22) Filed: Oct. 31, 2003

(65) Prior Publication Data

US 2004/0146803 A1   Jul. 29, 2004

Related U.S. Application Data

(60) Provisional application No. 60/423,013, filed on Nov. 1, 2002.

(51) Int. Cl.
   G03F 1/14   (2006.01)
   G03F 7/039  (2006.01)

(52) U.S. Cl. .................. 430/270.1; 430/273.1
(58) Field of Classification Search ............. 430/270.1, 430/273.1
   See application file for complete search history.

(56) References Cited

U.S. PATENT DOCUMENTS

| 5,525,190 | A | | 6/1996 | Wojnarowski et al. ...... 385/133 |
| 5,587,224 | A | * | 12/1996 | Hsieh et al. ................ 399/279 |
| 6,788,867 | B1 | * | 9/2004 | Mule' et al. ................ 385/129 |
| 2004/0132855 | A1 | * | 7/2004 | Kohl et al. ................ 522/150 |
| 2004/0248034 | A1 | * | 12/2004 | Henderson et al. ...... 430/270.1 |

OTHER PUBLICATIONS

U.S. Appl. No. 10/686,697, Oct. 16, 2003.*
P. A. Kohl, Q. Zhao, K. S. Patel, D. Schmidt, S. A. Bidstrup-Allen, R. Shick, S. Jayaraman, Air-Gaps for Electrical Interconnections, Electrochemical and Solid State Lett, vol. 1, p. 49, 1998.
P. A. Kohl, D. M. Bhusari, M. Wedlake, C. Case, B. C. Lee, R. J. Gutmann, R. Shick, Air-Gaps in 0.3 µm Electrical Interconnections, IEEE Electron Device Lett., vol. 21, p. 557, 2000.
H. A. Reed, C. E. White, V. Rao, S. A. Bidstrup-Allen, C. L. Henderson, P. A. Kohl, Fabrication of microchannels using polycarbonates as sacrificial materials, J Micromech Microeng., vol. 11(6), p. 733, 2001.
D. Bhusari, H. A. Reed, M. Wedlake, A. Padovani, S. A. Bidstrup-Allen, P. A. Kohl, Fabrication of Air-Channel Structures for Microfluidic, Microelectromechanical, and Microelectronic Applications, J Micromech. Microeng., vol. 10(3), p. 400, 2001.

(Continued)

Primary Examiner—Hoa Van Le
(74) Attorney, Agent, or Firm—Thomas, Kayden, Horstemeyer & Risley LLP

(57) ABSTRACT

Polymers, methods of use thereof, and methods of decomposition thereof, are provided. One exemplary polymer, among others, includes, a composition having a sacrificial polymer and a photoacid generator.

10 Claims, 18 Drawing Sheets

OTHER PUBLICATIONS

M. B. Anand, M. Yamada, H. Shibata, Use of Gas as Low-k Interlayer Dielectric in LSI's: Demonstration of Feasibility, IEEE Transactions on Electron Devices, vol. 44, p. 1965, 1997.

C. K. Harriett, G. W. Coates, H. G. Craighead, Heat-depolymerizable polycarbonates as electron beam patternable sacrificial layers for nanofluidics, J Vac. Sci. Technol B., vol. 19(6), p. 2842, 2001.

L. S. Lee, K. K. Gleason, Hot Filament Chemical Vapor Deposition of Polyoxymethylene as a Sacrificial Layer for Fabricating Air Gaps, Electrochemical and Solid State Lett., vol. 4, p. G81, 2001.

H-J. Suh, P. Bharathi, D. J. Beebe, J. S. Moore, Dendritic Material as a Dry-Release Sacrificial Layer, J. Microelectromech. Syst, vol. 9(2), pp. 198-205, 2000.

J. P. Gravesen, J. Bianejerg, O. S. Jensen, Microfluidics—A Review, J Micromech. Microeng., vol. 3, p. 168, 1993.

R. F. Service, Microchip Arrays Put DNA on the Spot, Science, vol. 282, p. 396, 1998.

J. V. Crivello, J. H. W. Lam, Diaryliodonium Salts. A New Class of Photoinitiatoers for Cationic Polymerization, Macromolecules, vol. 10(6), p. 1307, 1977.

R. Taylor, The Nature of the Transition State in Ester Pyrolysis. Part II. The Relative Rates of Pyrolysis of Ethyl, Isopropyl, and t-Butyl Acetates, Phenylacetates, Benzoates, Phenyl Carbonates, and N-Phenylcarbamates, J Chem. Soc, Chem. Commun., p. 1025, 1975.

S. Inoue, T. Tsuruta, T. Takada, N. Miyazaki, M. Kambe, T. Takaoka, Synthesis and Thermal Degradation of Carbon Dioxide-Epoxide Copolymer, Appl. Polym. Symp., vol. 26, p. 257, 1975.

J. M. J. Frechet, F. Bouchard, F. M. Houlihan, E. Eichler, B. Kryczka, C. G. Wilson, Design and synthesis of novel allyic and benzylic copolycarbonates susceptible to acidolytic or thermolytic depolymerization, Makromol. Chem. Rapid. Commun., vol. 7, p. 121, 1986.

S. C. Narang, S. T. Attarwala, Chemical Amplification in t-Diol Polycarbonate Resists, Polym. Prepr., (Am. Chem. Soc. Div. Polym., Chem ), vol. 26(2), p. 323, 1985.

D. J. Drensbourg, J. R. Wildeson, J. C. Yarbrough, J. H. Reibenspies, Bis 2,6-difluorophenoxide Dimeric Complexes of Zinc and Cadmium and Their Phosphine Adducts: Lessons Learned Relative to Carbon Dioxide/Cyclohexene Oxide Alternating Copolymerization Processes Catalyzed by Zinc Phenoxides, J Amer. Chem. Soc., vol. 122, p. 12487, 2000.

M. Murayama, F. Sanda, T. Endo, Anionic Ring-Opening Polymerization of a Cyclic Carbonate Having a Norbornene Structure with Amine Initiators, Macromolecules, vol. 31, p. 919, 1998.

Y. Toba, M. Saito, Y. Usui, Cationic Photopolymerization of Epoxides by Direct and Sensitized Photolysis of Onium Tetrakis(pentafluorophenyl)borate Iniators, Macromolecules, vol. 32(10), p. 3209, 1999.

J. V. Crivello, J. Lockhart, J. Lee, Diaryliodonium Salts as Thermal Initiators of Cationic Polymerization, J. Polym. Sci Part A: Polym. Chem., vol. 21, p. 97, 1983.

D. Bhusari, H. A. Reed, M. Wedlake, A. M. Padovani, S. A. Bidstrup-Allen, P. A. Kohl, Fabrication of Air-Channel Structures for Microfludic, Microelectromechanical, and Microelectronic Applications, J. Micrelectromechanical Sys., vol. 10, No. 3, pp. 400-408, Sep. 2001.

International Search Report, International Application No. PCT/US03/34198.

* cited by examiner

PCC

PCPC

PPC

PEC

PNC

DPI - TPFPB

TTBPS - TPFPB

TTBPS - HFP m/z: 210 m/z: 168 m/z: 58 m/z: 137 m/z: 116 m/z: 98

(a) Decomposition of the PAG

RH = Solvent or Polymer; $X^- = \left[B\left[\begin{smallmatrix}F&F\\F&F\\F&F\end{smallmatrix}\right]_4\right]^-$ (b) Acid catalyzed decomposition of PPC

SACRIFICIAL COMPOSITIONS, METHODS OF USE THEREOF, AND METHODS OF DECOMPOSITION THEREOF

CLAIM OF PRIORITY

This application claims priority to co-pending U.S. provisional application entitled "Novel Selective-Temperature Sacrificial Polymeric Materials" having Ser. No. 60/423,013, filed on Nov. 1, 2002, which is entirely incorporated herein by reference.

STATEMENT REGARDING FEDERALLY SPONSORED RESEARCH OR DEVELOPMENT

The U.S. government may have a paid-up license in this invention and the right in limited circumstances to require the patent owner to license others on reasonable terms as provided for by the terms of MDA awarded by the National Science Foundation (Grant #DMI-9980804) of the U.S. Government.

TECHNICAL FIELD

The present invention is generally related to sacrificial compositions, and, more particularly, is related to sacrificial polymers and their decomposition catalysts, methods of use thereof, and methods of decomposition of the sacrificial polymers.

BACKGROUND

A wide spectrum of microelectronic and microelectromechanical systems (MEMS) applications has increased the need for lower-temperature, thermally decomposable sacrificial materials. This includes fabrication of air-gaps in electrical interconnects, MEMS, microfluidic devices, and micro-reactors.

The formation of air-gaps is important in electrical interconnects because it lowers the effective dielectric constant of the matrix. The fabrication of buried air channels is useful for the creation of vias in multi-level wiring boards, micro-display boards with high resolution, and ink-jet printer heads. In MEMS technology, the fabrication of micro-air cavities may alleviate the stress associated with thermal expansion of materials and also can act as a temperature-activated release material.

Microfluidic devices and microreactors, fabricated with air-gap technology can be used for miniature-scale chemical syntheses, medical diagnostics, and micro-chemical analysis and sensors. In such devices, liquids and gases are manipulated in microchannels with cross-sectional dimensions on the order of tens to hundreds of micrometers. Processing in such microchannel devices offers a number of advantages including low reagent and analyte consumption, highly compact and portable systems, fast processing times, and the potential for disposable systems.

In spite of all of their promise, however, microfluidic devices are currently being used in a limited number of applications and are in general still rather simple devices in terms of their operational complexity and capabilities. For example, in terms of making truly portable microanalytical systems, one of the current difficulties involves the simple integration of electronic (e.g., sensing methods) and fluidic elements into the same device. One of the most important issues, controlling this ability to integrate functions into the same device, and thus controlling the level of functionality of a microfluidic device, is the method used to fabricate the structure.

The applications for a microfluidic device require the formation of buried microchannels in several different materials at a variety of temperatures. Polycarbonates have been used as a sacrificial material in fabricating nanofluidic devices by electron beam lithography. C. K. Harnett, et al., *J Vac. Sci. Technol. B.*, vol. 19(6), p. 2842, 2001. Air-gaps have been also fabricated using the hot-filament chemical vapor deposition of polyoxymethylene as a sacrificial layer. L. S. Lee, et al., *Electrochem. and Solid State Lett.*, vol. 4, p. G81, 2001. Further, highly structured, dendritic material, specifically hyperbranched polymers, have been used as a dry-release sacrificial material in the fabrication of a cantilever beam. H-J. Suh, et al., *J. Microelectromech. Syst.*, Vol. 9(2), pp. 198–205, 2000. Previous work has also fabricated air-gaps using non-photosensitive sacrificial polymers that decompose in the range 250–425° C. P. A. Kohl, et al., *Electrochemical and Solid State Lett.*, vol. 1, p. 49, 1998; D. Bhusari, et al., *J Micromech. Microeng.*, vol. 10(3), p. 400, 2001.

FIGS. 1A–1H are cross-sectional views that illustrate a previously proposed method 100 for forming a buried air cavity using a non-photosensitive sacrificial material. FIG. 1A illustrates a substrate 10, prior to having a non-photosensitive sacrificial material 12 disposed thereon by, for example, spin-coating as in FIG. 1B. FIG. 1C illustrates a hard mask 14 disposed on the sacrificial material 12. FIG. 1D illustrates a photolithographed and etched mask portion 16 disposed on the hard mask 14, while FIG. 1E illustrates the removal of the mask portion 16 and portions of the sacrificial polymer material 12 exposed to the plasma etching. The hard mask 14 is then removed, as shown in FIG. 1F.

FIG. 1G illustrates the formation of the overcoat layer 18 onto the sacrificial polymer 12 and the substrate 10. FIG. 1H illustrates the decomposition of the sacrificial polymer 12 to form air-regions 20. The sacrificial polymer 12 has conventionally been decomposed by heating the sacrificial polymer 12 to a temperature sufficient to decompose the polymer (e.g., about 300–425° C.). Prior sacrificial polymers have required high decomposition temperatures (e.g., about 300–425° C.), which limits the types of overcoat materials and substrates that may be used, as the overcoat and substrate materials must be able to withstand the high temperatures needed to decompose the sacrificial polymers. Even the use of a polycarbonate polymer as the sacrificial polymer lowers the decomposition temperature to about 250–280° C.

Thus, a heretofore unaddressed-need exists in the industry to address the aforementioned deficiencies and inadequacies.

SUMMARY OF THE INVENTION

Briefly described, embodiments of this disclosure, among others, include polymer compositions, methods of use thereof, and methods of decomposition thereof. An exemplary composition, among others, includes a sacrificial polymer that undergoes acid-catalyzed decomposition and a catalytic amount of a photoacid generator.

Methods of fabricating a structure are also provided. One exemplary method includes, among others: disposing a composition onto a surface, the composition including a sacrificial polycarbonate polymer and a photoacid generator; disposing a mask above the composition, the mask encoding a profile defining air-gaps to be formed in the composition; exposing the composition to energy through gaps in the mask; and removing portions of the composition to form air-gaps in the composition, the removed portions corresponding to the gaps in the mask.

Other compositions, methods, features, and advantages will be, or become, apparent to one with skill in the art upon examination of the following drawings and detailed description. It is intended that all such additional compositions, methods, features, and advantages be included within this description, be within the scope of the present invention, and be protected by the accompanying claims.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of this disclosure. Moreover, in the drawings, like reference numerals designate corresponding parts throughout the several views.

DETAILED DESCRIPTION

Figure 1A:
FIGS. 1A through 1H are cross-sectional views that illustrate a previously proposed method for forming buried air-gaps formation using a non-photosensitive sacrificial material.
Figure 1B:
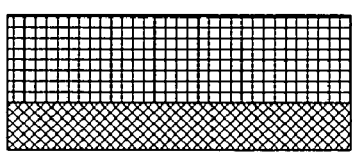
Figure 1C:
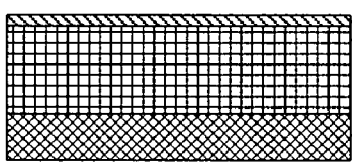
Figure 1D:
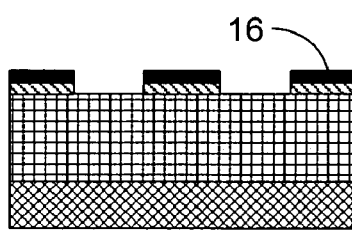
Figure 1E:
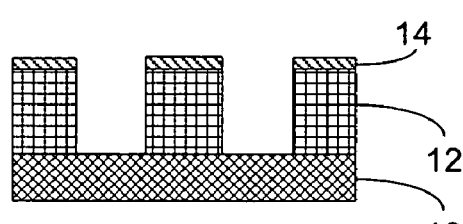
Figure 1F:
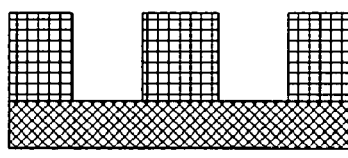
Figure 1G:
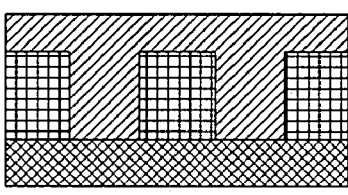
Figure 1H:
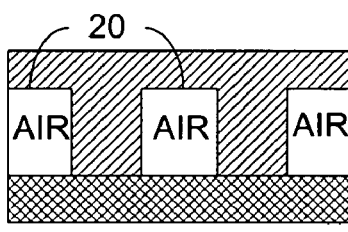

In general, polymers, methods of use thereof, structures formed therefrom, and methods of decomposition thereof, are disclosed: Embodiments of the polymer can be used to form air-gaps in electrical interconnects, microelectrorniechanical (MEMS), microfluidic devices, and micro-reactors. In addition, methods are disclosed in which sacrificial compositions are decomposed at reduced temperatures than traditionally used.

Embodiments of the disclosed sacrificial composition include, but are not limited to, a sacrificial polymer and one or more positive tone or negative tone components. The positive tone component can include a photoacid generator, for example.

In general, the photoacid generator can be used to make the sacrificial polymer easier to remove (e.g., less stable towards a solvent). For example, half of a layer of a sacrificial composition (e.g., a sacrificial polymer and a positive tone component) is exposed to energy, either in the form of thermal energy (e.g., increased temperature) or optical energy (e.g., ultraviolet (UV) light, near-ultraviolet light, and/or visible light), while the other half is not exposed. Subsequently, the entire layer is exposed to a solvent or heat and the solvent or heat dissolves the layer exposed to the energy.

Although not intending to be bound by theory, upon exposure to optical energy, a positive tone photoacid generator generates an acid. Then, upon exposure to a base or an increased temperature, the dissolution of the sacrificial polymer is increased relative to sacrificial composition not exposed to the optical or thermal energy. As a result, a mask, for example, can be used to fabricate three-dimensional structures from the sacrificial composition by removing the exposed sacrificial polymer.

In general, negative tone compositions can be used making the sacrificial polymer more difficult to remove (e.g., more stable towards a solvent or heat that normally would dissolve the sacrificial polymer). For example, half of a layer of a sacrificial composition (including a sacrificial polymer and a negative tone photoinitiator) is exposed to optical energy, while the other half is not exposed. Subsequently, the entire layer is exposed to a solvent or heat and the solvent or heat dissolves the layer not exposed to the optical energy.

More specifically, the area exposed includes a cross-linked photodefinable polymer, while portions not exposed include an uncross-linked photodefinable polymer. The uncross-linked photodefinable polymer can be removed with the solvent leaving the cross-linked photodefinable polymer behind (e.g., a photodefinable three-dimensional structure).

Although not intending to be bound by theory, upon exposure to optical energy, one type, among others, of the negative tone photoinitiator can generate free radicals that initiate cross-linking reactions between the sacrificial polymers to form a cross-linked photodefinable polymer. Therefore, a mask, for example, can be used to fabricate photodefinable three-dimensional structures from the photodefinable polymer by removing the uncross-linked photodefinable polymer.

In general, the sacrificial composition can be used in areas such as, but not limited to, microelectronics (e.g., microprocessor chips, communication chips, and optoeletronic chips), microfluidics, sensors, analytical devices (e.g., microchromatography), as a sacrificial material to create three-dimensional structures that can be subsequently have formed therein air-regions (also referred to herein interchangeably as "air-gaps," "air cavities," and/or "air channels") by thermally decomposing the sacrificial polymer. In addition, the sacrificial polymer can be used as an insulator, for example.

For embodiments using the sacrificial composition to create air-regions having three-dimensional structures, the decomposition of the sacrificial composition should produce gas molecules small enough to permeate one or more of the materials surrounding the sacrificial composition (e.g., an overcoat layer). In addition, the sacrificial composition preferably decomposes slowly, so as not to create undue pressure build-up while forming the air-region within the surrounding materials. Furthermore, the sacrificial composition desirably has a decomposition temperature less than the decomposition or degradation temperature of the surrounding material. The sacrificial composition also desirably has a decomposition temperature above the deposition or curing temperature of an overcoat material but less than the degradation temperature of the components in the structure in which the sacrificial composition is being used.

Figure 5:
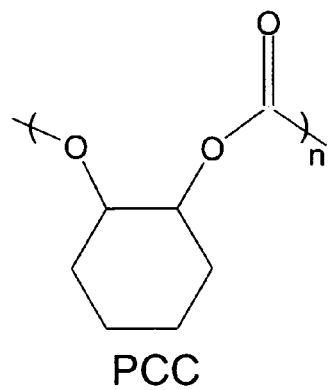
FIG. 5 illustrates chemical structures of exemplary sacrificial polymers used in the methods of FIGS. 2–4.
Figure 5:
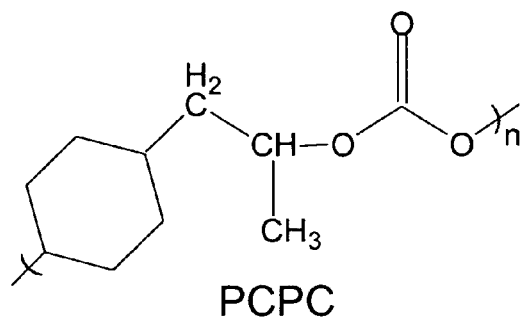
Figure 5:
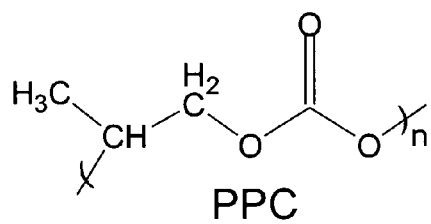
Figure 5:
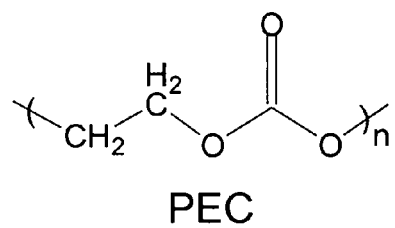
Figure 5:
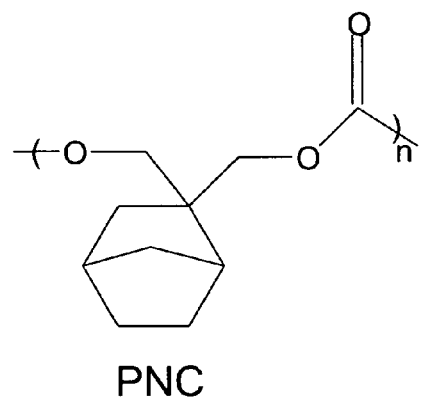

The sacrificial polymer can include compounds such as, but not limited to, polynorbornenes, polycarbonates, functionalized compounds of each, a copolymer of polynorbornene and polynorbornene carbonate, and combinations thereof. The polynorbornene can include, but is not limited to, an alkenyl-substituted norbornene (e.g., cyclo-acrylate norbornene). The polycarbonate can include, but is not limited to, polypropylene carbonate (PPC), polyethylene carbonate (PEC), polycyclohexane carbonate (PCC), polycyclohexanepropylene carbonate (PCPC), and polynorbornene carbonate (PNC), and combinations thereof. The chemical structures of representative sacrificial polymers included in the disclosed sacrificial composition are depicted in FIG. 5. Specific polycarbonates that may be used as the disclosed sacrificial polymer include, for example, poly [(oxycarbonyloxy-1,1,4,4-tetramethylbutane)-alt-(oxycarbonyloxy-5-norbornene-2-endo-3-endo-dimethane)]; poly [(oxycarbonyloxy-1,4-dimethylbutane)-alt-(oxycarbonyloxy-5-norbornene-2-endo-3-endo-dimethane)]; poly[(oxycarbonyloxy-1,1,4,4-tetramethylbutane)-alt-(oxycarbonyloxy-p-xylene)]; and poly[(oxycarbonyloxy-1,4-dimethylbutane)-alt-(oxycarbonyloxy-p-xylene)]. In general, the molecular weight of the disclosed sacrificial polymers is from about 10,000 to 200,000.

The sacrificial polymer can be from about 1% to 50% by weight of the sacrificial composition. In particular, the sacrificial polymer can be from about 5% to 15% by weight of the sacrificial composition.

As mentioned above, the sacrificial composition can include either a negative tone component and/or a positive tone component. The negative tone component can include compounds that generate a reactant that would cause the crosslinking in the sacrificial polymer. The negative tone component can include compounds, such as, but not limited to, a photosensitive free radical generator. Alternative negative tone components can be used, such as photoacid generators (e.g., in epoxide-functionalized systems).

A negative tone photosensitive free radical generator is a compound which, when exposed to light breaks into two or more compounds, at least one of which is a free radical. In particular, the negative tone photoinitiator can include, but is not limited to, bis(2,4,6-trimethylbenzoyl)-phenylphosphineoxide (Irgacure 819, Ciba Specialty Chemicals Inc.); 2-benzyl-2-dimethylamino-1-(4-morpholinophenyl)-butanone-1 (Irgacure 369, Ciba); 2,2-dimethoxy-1,2-diphenylethan-1-one (Irgacure 651, Ciba); 2-methyl-1[4-(methylthio)-phenyl]- 2-morpholinopropan-1-one (Irgacure 907, Ciba); benzoin ethyl ether (BEE, Aldrich); 2-methyl-4'-(methylthio)-2-morpholino-propiophenone; 2,2'-dimethoxy-2-phenyl-acetophenone (Irgacure 1300, Ciba); 2,6-bis(4-azidobenzylidene)-4-ethylcyclohexanone (BAC-E), and combinations thereof.

Figure 6:
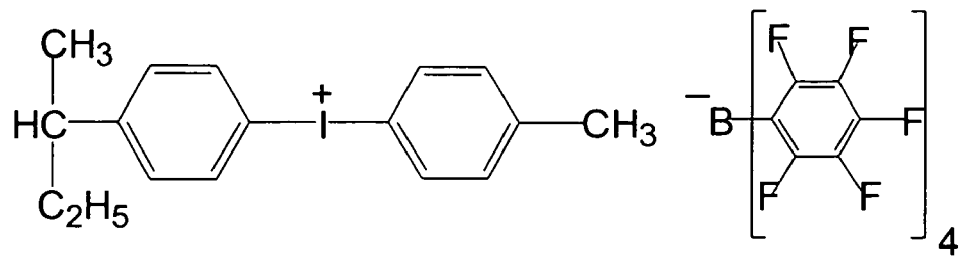
FIG. 6 illustrates chemical structures of exemplary photoacid generators used in the methods of FIGS. 2–3.
Figure 6:
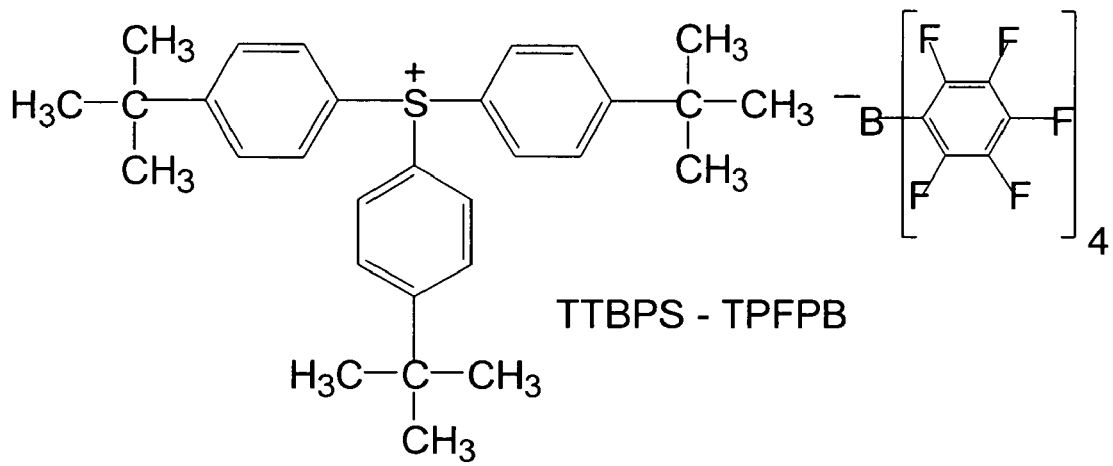
Figure 6:
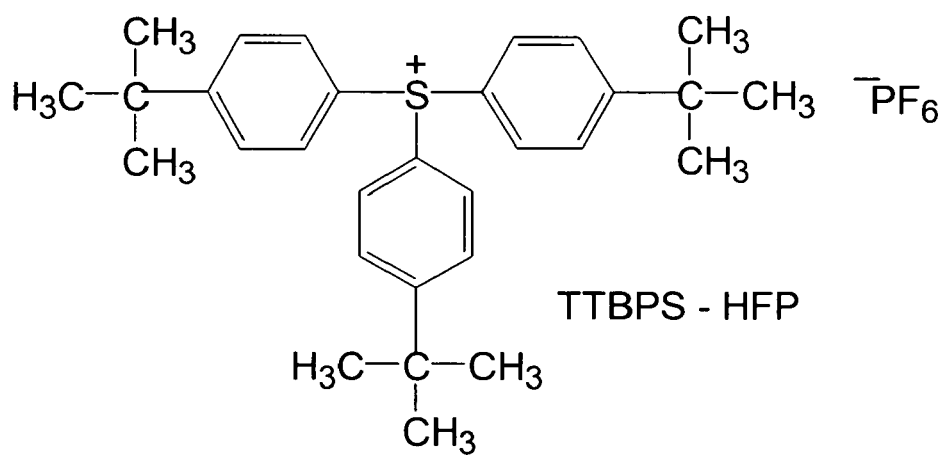
Figure 7:
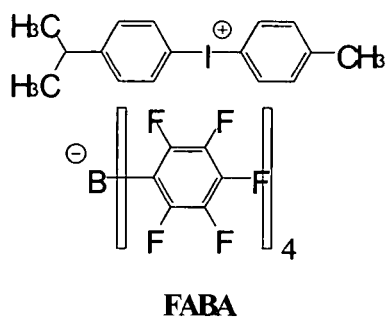
FIG. 7 illustrates chemical structures of further exemplary photoacid generators used in the methods of FIGS. 2–3.
Figure 7:
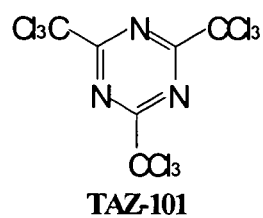
Figure 7:
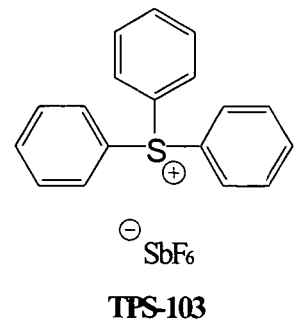
Figure 7:
Figure 7:
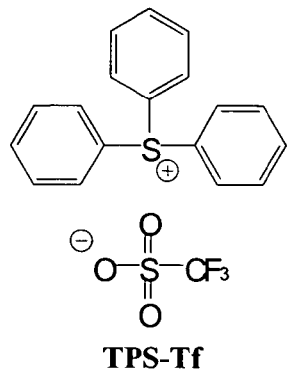
Figure 7:
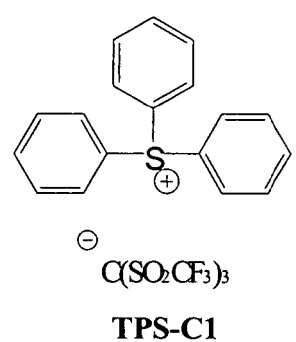
Figure 7:
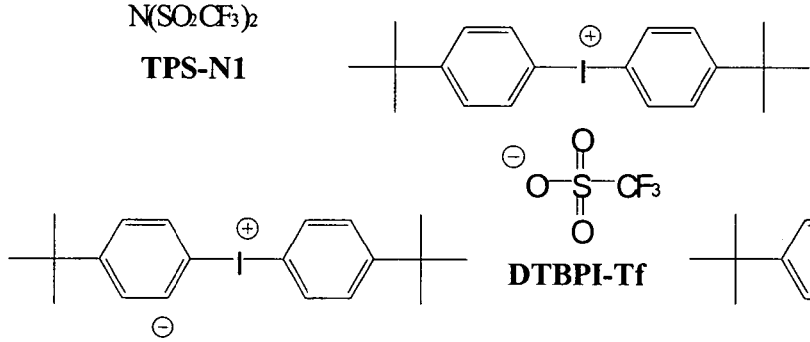
Figure 7:
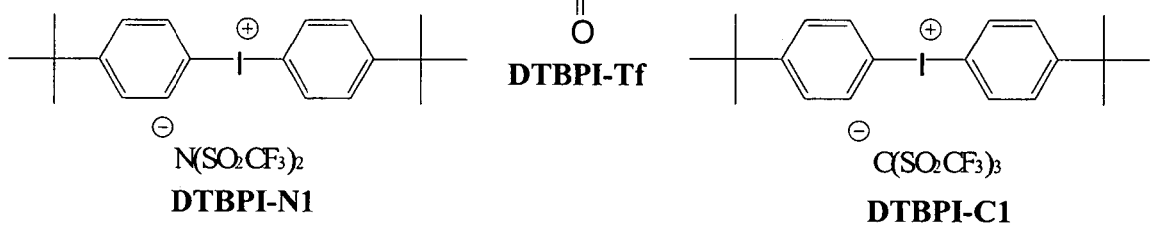
Figure 7:
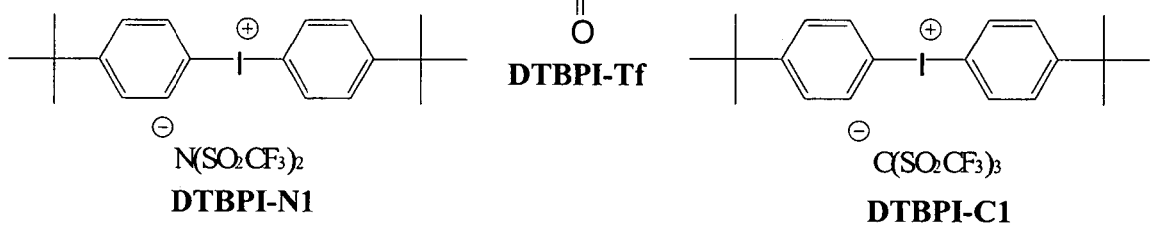

The positive tone component can include, but is not limited to, photoacid generator(s). More specifically, the positive tone photoacid generator can include, but is not limited to, nucleophilic halogenides (e.g., diphenyliodonium salt, diphenylfluoronium salt) and complex metal halide anions (e.g., triphenylsulphonium salts). In particular, the photoacid generator can be tetrakis(pentafluorophenyl)borate-4-methylphenyl[4-(1-methylethyl)phenyl] iodonium (DPI-TPFPB); tris(4-t-butylphenyl)sulfonium tetrakis-(pentafluorophenyl)borate (TTBPS-TPFPB); tris(4-t-butylphenyl)sulfonium hexafluorophosphate (TTBPS-HFP); triphenylsulfonium triflate (TPS-Tf); bis(4-tert-butylphenyl) iodonium triflate (DTBPI-Tf); triazine (TAZ-101); triphenylsulfonium hexafluoroantimonate (TPS-103); Rhodosil™ Photoinitiator 2074 (FABA); triphenylsulfonium bis(perfluoromethanesulfonyl) imide (TPS-N1); di-(p-t-butyl) phenyliodonium bis(perfluoromethanesulfonyl) imide (DTBPI-N1); triphenylsulfonium; tris(perfluoromethanesulfonyl) methide (TPS-C1); di-(p-t-butylphenyl)iodonium tris(perfluoromethanesulfonyl)methide (DTBPI-C1); and combinations thereof, the chemical structures of which are depicted in FIGS. 6 and 7.

The photoacid generator can be from about 0.5% to 5% by weight of the sacrificial composition. In particular, the photoacid generator can be from about 1% to 3% by weight of the sacrificial composition.

The remaining percentage of the sacrificial composition not accounted for in the photoacid generator and sacrificial polymer (e.g., from about 50% to about 99%) can be made up with solvent, such as, but not limited to, mesitylene, N-methyl-2-pyrrolidinone, propylene carbonate, anisole, cyclohexanone, propylene glycol monomethyl ether acetate, N-butyl acetate, diglyme, ethyl 3-ethoxypropionate, and combinations thereof.

Exemplary sacrificial polymers include those chemical structures depicted in FIG. 5. When using sacrificial polymers to fabricate air-gap structures, it is helpful to know the degradation temperatures of the sacrificial polymers. Table 1 below shows the half-decomposition temperatures, $T_{1/2d}$ (where $T_{1/2d}$ is the temperature at 50% weight loss) of exemplar sacrificial polymers under various experimental conditions, determined using dynamic thermogravimetric analysis (TGA). Table 1. Half-decomposition temperatures, $T_{1/2d}$ (where $T_{1/2d}$ is the temperature at 50% weight loss) of exemplar sacrificial polymers under various conditions.

| Entry | Polycarbonate | Solvent | PAG | PIAD T$_{1/2d}$ (° C.) | TIAD T$_{1/2d}$ (° C.) | TD T$_{1/2d}$ (° C.) |
|---|---|---|---|---|---|---|
| 1. | 12% PPC | Anisole | DPI-TPFPB | 102 ± 2 | 180 ± 2 | 212 ± 2 |
| 2. | 20% PPC | Anisole | TTBPS-TPFPB | 125 ± 2 | 214 ± 2 | 212 ± 2 |
| 3. | 10% PEC | Propylene carbonate | DPI-TPFPB | 114 ± 2 | 189 ± 2 | 182 ± 2 |
| 4. | 10% PEC | Propylene carbonate | TTBPS-HFP | 117 ± 2 | 184 ± 2 | 182 ± 2 |
| 5. | 12% PCC | Anisole | DPI-TPFPB | 177 ± 2 | 199 ± 2 | 270 ± 2 |
| 6. | 35% PCC | Anisole | TTBPS-TPFPB | 191 ± 2 | 252 ± 2 | 270 ± 2 |
| 7. | 20% PCPC | Anisole | DPI-TPFPB | 160 ± 2 | 194 ± 2 | 252 ± 2 |
| 8. | 20% PCPC | Anisole | TTBPS-TPFPB | 186 ± 2 | 249 ± 2 | 252 ± 2 |
| 9. | 12% PNC | Anisole | DPI-TPFPB | 207 ± 2 | 194 ± 2 | 305 ± 2 |
| 10. | 50% PNC | Anisole | TTBPS-TPFPB | 196 ± 2 | 291 ± 2 | 304 ± 2 |

Now having described the sacrificial composition in general, the following describes exemplar embodiments for using the sacrificial composition to produce three-dimensional structures, where the three-dimensional structures can be decomposed to form air-regions (e.g., a gas filled region substantially excluding a solid or liquid material or a vacuum-region).

In general, disposing a layer of the sacrificial composition onto a substrate and/or layer of material on the substrate can produce a three-dimensional structure. A mask is disclosed on or above the sacrificial composition or portions thereof that encodes the shape of the three-dimensional structure, as described below. After exposing the sacrificial composition through the mask to optical and/or thermal energy and removing the unexposed sacrificial composition (negative tone) or the exposed sacrificial composition (positive tone), the three-dimensional structure is formed.

The mask encodes a density profile that defines the three-dimensional structure. Upon exposure of the mask to optical and/or thermal energy, a known amount of the energy is allowed to pass through portions of the mask. The design of the mask is used to control the amount of energy allowed to pass through the mask. In particular, the mask can be designed to control the amount of energy allowed to pass through the mask as a function of the position on the mask. Thus, the mask can be designed and used to produce the three-dimensional structure from the sacrificial composition by altering the amount of energy allowed to pass through the mask as a function of the position on the mask. The mask can be formed by methods known in the art (e.g., U.S. Pat. No. 4,622,114).

The three-dimensional structures (and the corresponding air-regions) can have cross-sectional areas section such as, but not limited to, non-rectangular cross-sections, asymmetrical cross-sections, curved cross sections, arcuate cross sections, tapered cross sections, cross sections corresponding to an ellipse or segment thereof, cross sections corresponding to a parabola or segment thereof, cross sections corresponding to a hyperbola or segment thereof, and combinations thereof. For example, the three-dimensional structures can include, but are not limited to, non-rectangular structures, non-square structures, curved structures, tapered structures, structures corresponding to an ellipse or segment thereof, structures corresponding to a parabola or segment thereof, structures corresponding to a hyperbola or segment thereof, and combinations thereof. In addition, the three-dimensional structures can have cross-sectional areas having a spatially-varying height. Although not illustrated, a non-rectangular, tapered, and asymmetrical air-region can be formed in conjunction with other air-regions and/or air-channels to form microfluidic devices, sensors, and analytical devices, for example.

Figure 2A:
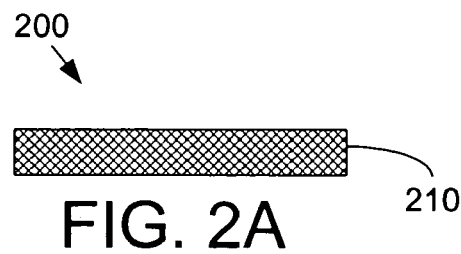
FIGS. 2A through 2F are cross-sectional views that illustrate a representative method for forming buried air-gaps using a polymer that undergoes acid-catalyzed decomposition.
Figure 2B:
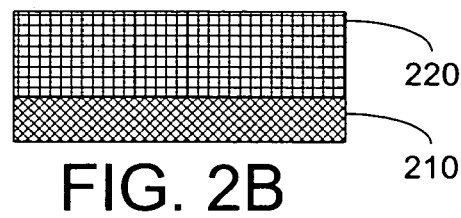
Figure 2C:
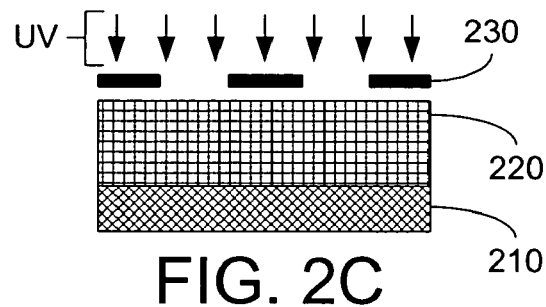
Figure 2D:
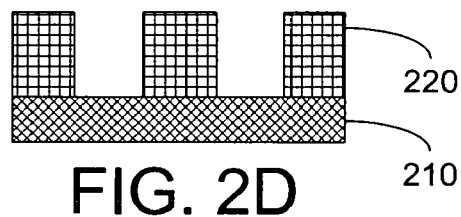
Figure 2E:
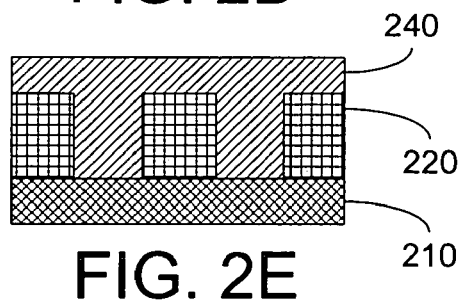
Figure 2F:
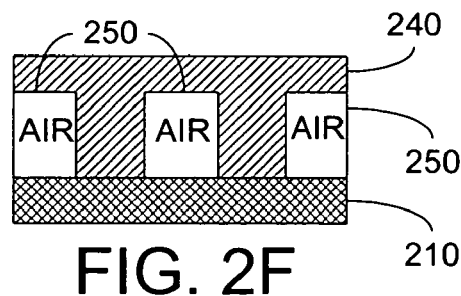

An exemplar embodiment of a device with air-regions 250 formed therein in shown in cross-section in FIG. 2F. The device may include a substrate 210, and an overcoat layer 240.

A substrate 210 on which the sacrificial composition is disposed can be used in systems such as, but not limited to, microprocessor chips, microfluidic devices, sensors, analytical devices, and combinations thereof. Thus, the substrate 210 can be made of materials appropriate for the particular desired system or device. Exemplar materials, however, include, but are not limited to, glasses, silicon; silicon compounds, germanium, germanium compounds, gallium, gallium compounds, indium, indium compounds, or other semiconductor materials and/or compounds. In addition, the substrate 210 can include non-semiconductor substrate materials, including any dielectric material, metals (e.g., copper and aluminum), ceramics, or organic materials found in printed wiring boards, for example.

The overcoat layer 240 can be a modular polymer that includes the characteristic of being permeable or semi-permeable to the decomposition gases produced by the decomposition of a sacrificial polymer while forming the air-region 250. In addition; the overcoat layer 240 has elastic properties so as to not rupture or collapse under fabrication and use conditions. Further, the overcoat layer 240 is stable in the temperature range in which the sacrificial composition decomposes.

Examples of the overcoat layer 240 include compounds such as, but not limited to, polyimides, polynorbornenes, epoxides, polyarylenes ethers, polyarylenes, inorganic glasses, and combinations thereof. More specifically the overcoat layer 240 includes compounds such as Amoco Ultradel™ 7501, Promerus Avatrel™ Dielectric Polymer, DuPont 2611, DuPont 2734, DuPont 2771, DuPont 2555, silicon dioxide, silicon nitride, and aluminum oxide. The overcoat layer 240 can be deposited onto the substrate 210 using techniques such as, for example, spin coating, doctor-blading, sputtering, lamination, screen or stencil-printing, chemical vapor deposition (CVD), metalorganic chemical vapor deposition (MOCVD), and plasma-based deposition systems.

It should be noted that additional components could be disposed on and/or within the substrate 210, the overcoat layer 240, and/or the air-region 250. In addition, the additional components can be included in any structure having air-regions as described herein. The additional components can include, but are not limited to, electronic elements (e.g., switches and sensors), mechanical elements (e.g., gears and motors), electromechanical elements (e.g., movable beams and mirrors), optical elements (e.g., lens, gratings, and mirror), opto-electronic elements, fluidic elements (e.g., chromatograph and channels that can supply a coolant), and combinations thereof.

FIGS. 2A–2F are cross-sectional views that illustrate a representative method 200 for forming an air-region using a sacrificial composition, the sacrificial composition including a sacrificial polymer and a positive tone component. FIG. 2A illustrates a substrate 210, prior to having a sacrificial material 220 disposed thereon by, for example, spin-coating as shown in FIG. 2B. FIG. 2C illustrates a mask 230 disposed on or above the sacrificial material 220 and the sacrificial material 220 being subjected to energy/radiation. While FIG. 2C depicts the energy being applied in the form of UV radiation, other forms of optical energy or thermal energy can be applied.

FIG. 2D illustrates the removal of selected portions of the sacrificial composition 220 that was exposed to the UV radiation of FIG. 2C through the mask 230. The mask 230 encodes an optical density profile that defines the cross-section of the air-region 250. The removed portions of the sacrificial composition 220 are removed by heating the sacrificial composition. The temperature used to remove irradiated portions of the sacrificial material 220 is lower than the methods of the prior art, due to the presence of a photoacid generator, described above, in the sacrificial composition 220. The temperature required to substantially decompose the irradiated sacrificial polymer 220 in the step shown in FIG. 2C is about 50° C. to 400° C. For example, the temperature may be about 110° C.

FIG. 2E illustrates the formation of the overcoat layer 240 onto the sacrificial polymer 220 and exposed substrate 210. FIG. 2F illustrates the decomposition of the sacrificial polymer 220 to form the air-regions 250. The temperature required to substantially decompose the sacrificial polymer in the step shown in FIG. 2F is about 100° C. to 250° C. For example, the temperature may be about 170° C.

Figure 3A:
FIGS. 3A through 3F are cross-sectional views that illustrate an alternative representative method for forming buried air-gaps using a polymer that undergoes acid-catalyzed decomposition.
Figure 3B:
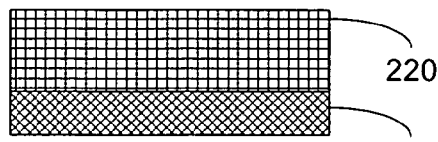
Figure 3C:
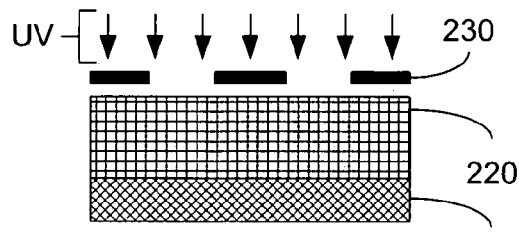

FIGS. 3A–3F are cross-sectional views that illustrate an alternative method 300 for forming an air-region 250 using a sacrificial composition, the sacrificial composition including a sacrificial polymer and a positive tone component. FIG. 3A illustrates a substrate 210, prior to having a sacrificial material 220 disposed thereon by, for example, spin-coating as shown in FIG. 3B. FIG. 3C illustrates a mask 230 disposed on or above the sacrificial material 220 and the sacrificial material 220 being subjected to energy/radiation. While FIG. 3C depicts the energy being applied in the form of UV radiation, other forms of optical energy, or thermal energy, can be applied.

Figure 3D:
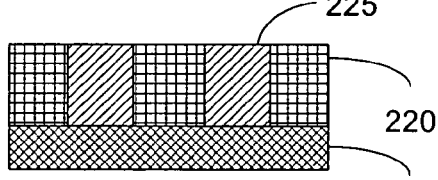
Figure 3E:
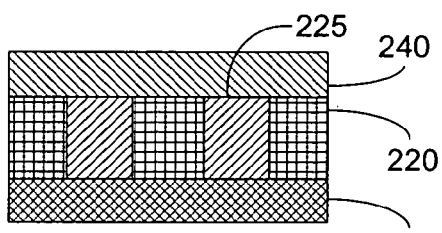
Figure 3F:
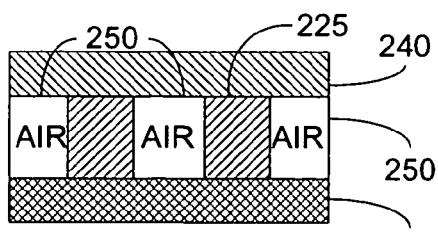

FIG. 3D illustrates the cross-linked sacrificial composition region 225 after exposure through the mask 230 to optical energy. FIG. 3E illustrates the formation of the overcoat layer 240 onto the sacrificial polymer 220 and cross-linked composition regions 225. FIG. 3F illustrates the decomposition of the un-crosslinked sacrificial polymer 220 to form the air-regions 250. The removed portions of the sacrificial composition 220 are removed by heating the sacrificial composition. The temperature used to remove irradiated portions of the sacrificial material 220 in FIG. 3F is lower than the methods of the prior art, due to the presence of a photoacid generator, described above, in the sacrificial composition 220.

Figure 4A:
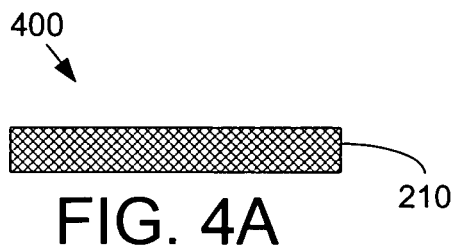
FIGS. 4A through 4F illustrate cross-sectional views that illustrate an alternative representative method for forming buried air cavities using a polymer that undergoes negative-tone stabilization to make the sacrificial polymer more difficult to decompose.
Figure 4B:
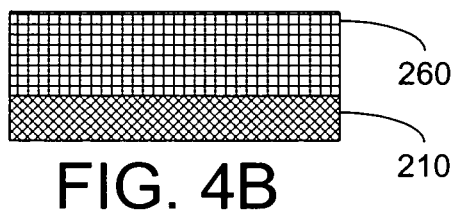
Figure 4C:
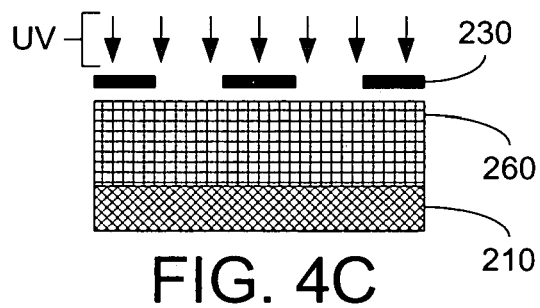
Figure 4D:
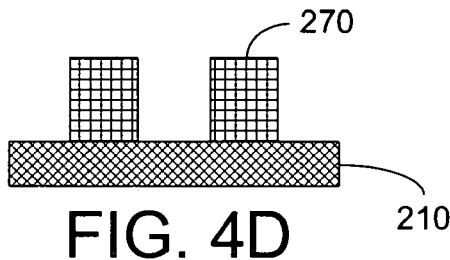
Figure 4E:
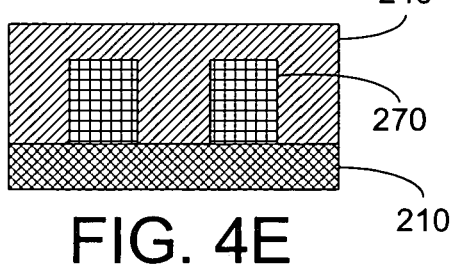
Figure 4F:
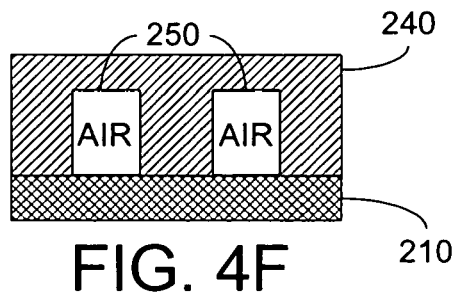

FIGS. 4A through 4F are cross-sectional views that illustrate a representative process 400 for fabricating the air-regions 250 illustrated in FIG. 4F. It should be noted that for clarity, some portions of the fabrication process are not included in FIGS. 4A through 4F. As such, the following fabrication process is not intended to be an exhaustive list that includes all steps required for fabricating the air-regions 250. In addition, the fabrication process is flexible because the process steps may be performed in a different order than the order illustrated in FIGS. 4A through 4F, or some steps may be performed simultaneously.

FIG. 4A illustrates the substrate 210. FIG. 4B illustrates the substrate 210 having the sacrificial composition 260 (negative tone) disposed thereon. The sacrificial composition 260 can be deposited onto the substrate 210 using techniques such as, for example, spin coating, doctor-blading, sputtering, lamination, screen or stencil-printing, melt dispensing, chemical vapor deposition (CVD), metalorganic chemical vapor deposition (MOCVD), and plasma-based deposition systems.

FIG. 4C illustrates a mask 230 disposed on or above the sacrificial composition 260. The mask 230 encodes an optical density profile that defines the cross-section of the photodefinable air-region 250.

FIG. 4D illustrates the cross-linked sacrificial composition region 270 after exposure through the mask 230 to optical energy, after the removal of the selected uncross-linked sacrificial composition material 270. The uncross-linked sacrificial composition material 260 can be removed by dissolution in a liquid, such as a solvent And/or heat, for example, or by any other method that can remove or dissolve the polymer component of the sacrificial composition material 260.

FIG. 4E illustrates the formation of the overcoat layer 240 onto the cross-linked sacrificial composition region 270. The overcoat layer 240 can be deposited onto the substrate 210 using techniques such as, for example, spin coating, doctor-blading, sputtering, lamination, screen or stencil-printing, melt dispensing, chemical vapor deposition (CVD), metalorganic chemical vapor deposition (MOCVD), and plasma-based deposition systems.

FIG. 4F illustrates the decomposition of the cross-linked sacrificial composition region 270 to form the air-region 250. The cross-linked sacrificial composition region 270 can be decomposed by heating the cross-linked sacrificial composition 270 to a temperature sufficient to decompose the polymer (e.g., about 250° C.).

Thermogravimetric Analysis of Representative Sacrificial Composition Film

Figure 8:
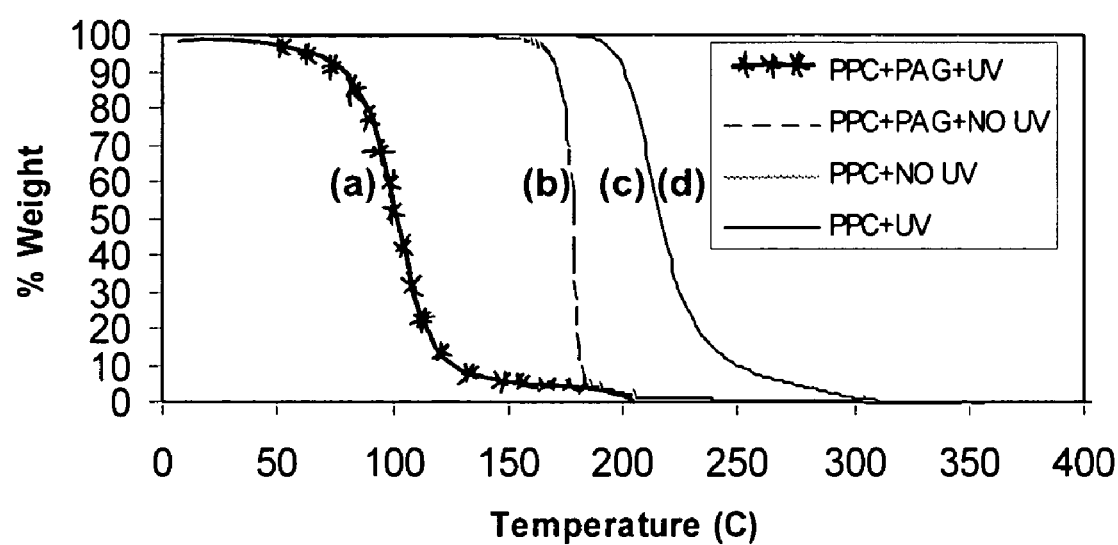
FIG. 8 is a thermogravimetric plot of various disclosed sacrificial compositions.

FIG. 8 illustrates the dynamic thermogravimetric (TGA) results for an exemplar sacrificial composition of a sacrificial polymer, polypropylene carbonate (PPC), and a photoacid generator (PAG). The composition was comprised of approximately 12 wt % PPC and 5 wt % DPI-TPFPB of PPC ("PPC:PAG"). The representative samples were prepared by spin-coating the polymer in anisole onto a silicon wafer, soft baking on a hotplate at about 110° C. for 10 minutes to evaporate the solvent and then exposing, where applicable, to 1 J/cm$^2$ of 240 nm UV irradiation. The samples were then removed from the silicon and analyzed by dynamic TGA ramping from 30 to 450° C. at the rate of 1° C. under a nitrogen atmosphere.

FIG. 8 shows the TGA thermograms for (a) PPC:PAG after UV irradiation, (b) PPC:PAG without UV irradiation, (c) PPC without PAG, and (d) PPC without PAG but with UV irradiation. As shown in FIG. 8(*a*), the onset temperature for the photo-acid induced decomposition was found to be 80° C., and the $T_{1/2d}$ was 100° C. The decomposition was complete at 230° C. with less than 3 wt % residue in the TGA pan.

When the sacrificial polymer material was not UV irradiated (FIG. 8(b)), decomposition occurred via the thermolytically induced PAG acid generation once the temperature reached the decomposition temperature of the PAG. The decomposition occurred in a narrow temperature range from the onset at 168° C. At 230° C., the thermal-acid induced decomposition was complete with less than 1.5 wt % residue.

The decomposition behavior of PPC without PAG is shown in FIG. 8(c), and the $T_{1/2d}$ was found to be 210° C. At 230° C., 19 wt % of the mass remained in the pan. The decomposition was complete at 287° C. with 3 wt % residue. At 350° C., the weight percentages of the residues were 1.79%, 0.12% and 0.37% for (a), (b), and (c), respectively, under the same experimental conditions.

The decomposition behavior of the sacrificial polymer (here, PPC) film without PAG but exposed to UV irradiation (FIG. 8(d)) was found to be similar to that of the non-UV irradiated sacrificial polymer film. This shows that no change occurred in the sacrificial polymer upon UV irradiation without PAG. Thus, the photo-acid induced decomposition of the polycarbonates significantly lowers the decomposition temperatures; however, it leaves more residue than the thermolytically induced acid-catalyzed decomposition or thermolytic decomposition of polypropylene carbonate alone. The residue level can be brought to less than 1 wt % by lowering the percentage of PAG level in the formulation for the acid-catalyzed degradation.

Figure 9:
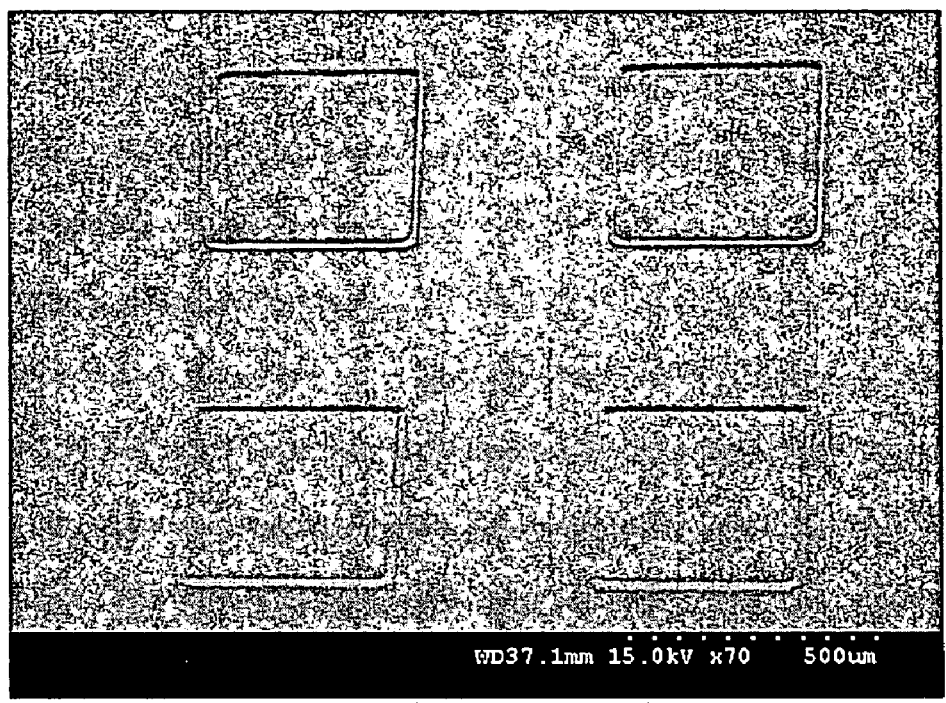
FIG. 9 is a scanning electron microscope (SEM) micrograph of the lithographic images of an air-gap formed from a representative disclosed sacrificial composition.
Figure 9:
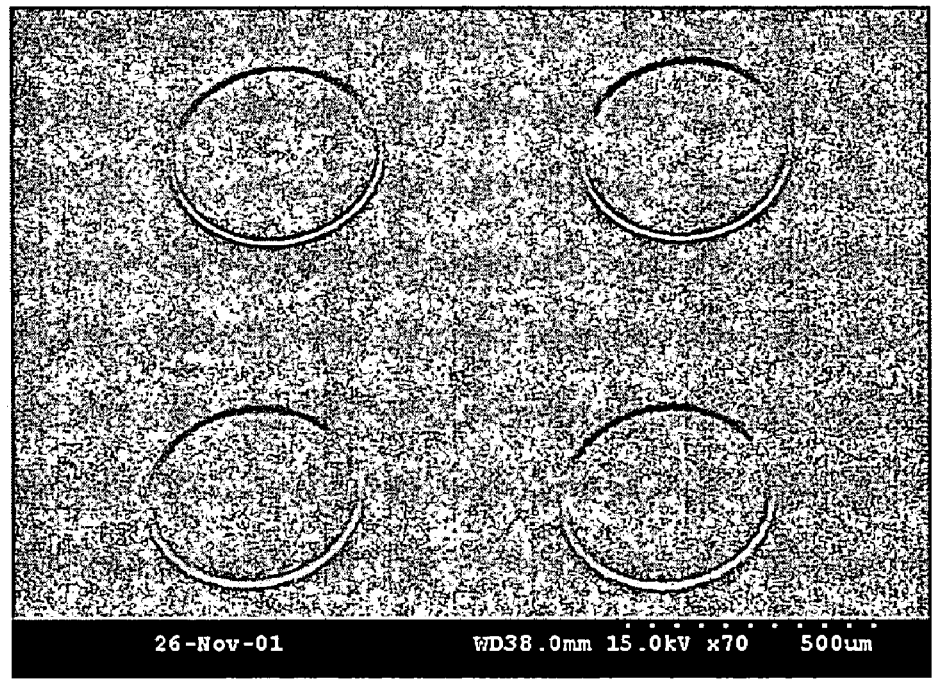

Photopatterning and Fabrication of Air-Gaps Using Photosensitive Sacrificial Compositions Positive-tone patterns obtained using PPC (12 wt %):DPI-TPFPB (5 wt % of PPC) formulation in anisole. The solution was spin-coated onto a silicon and soft-baked on a hotplate at 110° C. for 10 min to achieve a thickness of 1.58 µm. The film was UV irradiated through a clear-field quartz mask with a dose of 1 J/cm² (240 nm). The film was dry-developed by post-exposure baking at 110° C. on a hotplate for 3 min. At 110° C., the UV generated acid induced the decomposition of the PPC. FIG. 9 shows scanning electron microscope (SEM) micrographs of lithographic images produced using a dark-field mask. The process was repeated as above except a PPC (20 wt %):DPI-TPFPB (5 wt % of PPC) in anisole formulation was used to achieve a 5.45 µm thick film. The circles and squares are the areas in which the PPC has been decomposed and removed.

Examples of Implementations of Disclosed Methods

Figure 10:
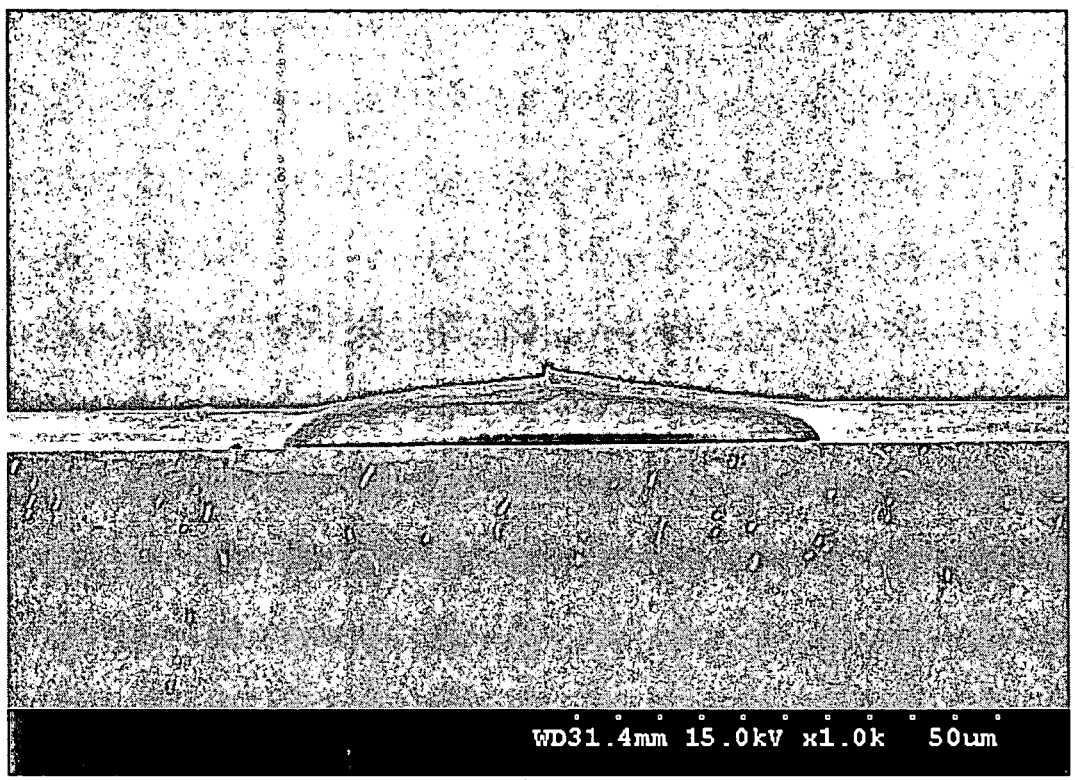
FIG. 10 is a SEM micrograph of an air-gap formed from an alternative sacrificial composition.

Air-gaps were fabricated via the process flow using method 200 depicted in FIG. 2 using photosensitive polycarbonates as the sacrificial polymeric material. Two different encapsulating materials were used: Avatrel EPM™ and Avatrel 2000P™ (Promerus, LLC.). First, the photosensitive PPC (12 wt %):DPI-TPFPB (5 wt % of PPC) formulation was spin-coated onto a silicon wafer and soft-baked on a hotplate at 100° C. for 10 minutes to achieve a thickness of 5.45 µm. The photosensitive film was photopatterned using a clear-field mask having lines/space pattern with 70-µm wide lines and 35-µm wide spaces. Post-exposure baking at 110° C. for 1–10 min. decomposed the UV irradiated area. The AVATREL EPM encapsulating material was spin-coated and soft-baked on a hotplate at 80° C. for 5 minutes. The unexposed area was decomposed in a Lindberg horizontal tube furnace at 150° C. for 4 hours under nitrogen. FIG. 10 shows a cross-sectional SEM micrograph image of the 70-µm wide resulting air channel structure encapsulated by 3.9 µm AVATREL EPM™ dieletric material. A similar fabrication process sequence was followed, using AVATREL 2000P™ as the encapsulating material. However, after spin-coating AVATREL 2000P, the film was UV irradiated with 1 J/cm² at 365 nm and post-exposure baked in an oven at 110° C. for 30 minutes. Upon baking, the AVATREL 2000P™ polymer was cross-linked. The resulting thickness of the overcoat was 9.3 µm. The unexposed sacrificial polymer was then decomposed in a Lindberg horizontal tube furnace at 170° C. for 1 hour under nitrogen.

Figure 11:
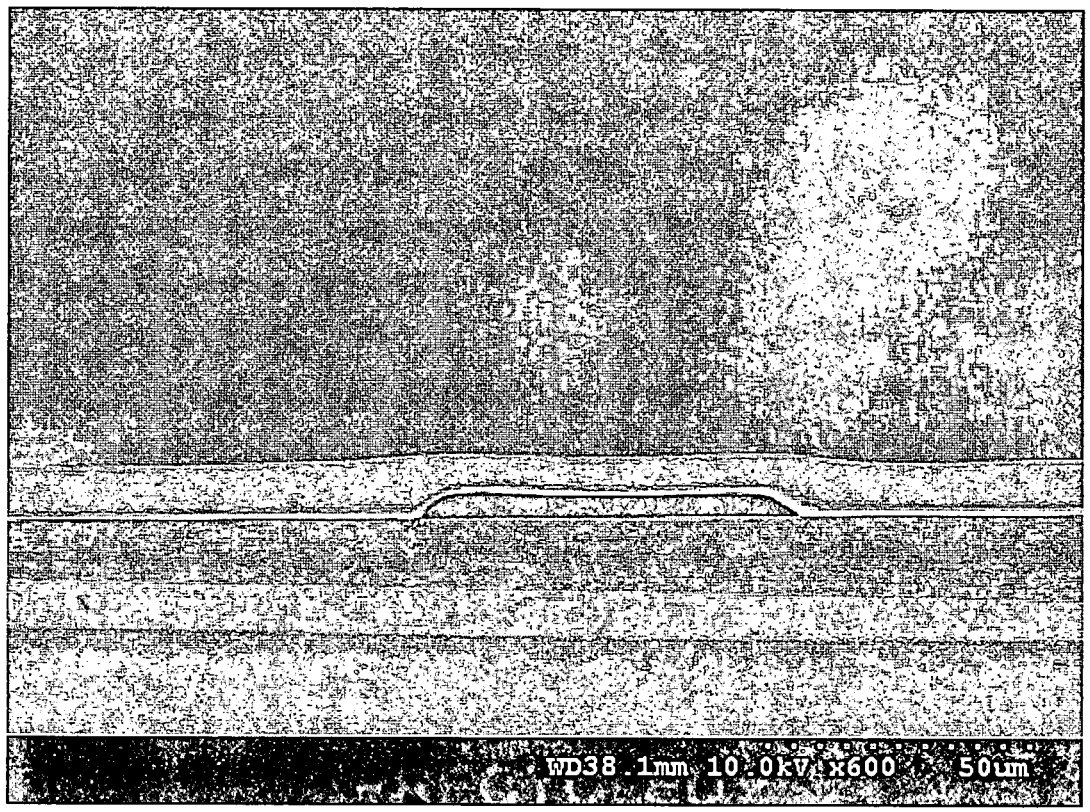
FIG. 11 is a SEM micrograph of an air-gap formed from an alternative sacrificial composition.

FIG. 11 shows an SEM image of the resulting 70-µm wide buried air-channel in AVATREL 2000P™ encapsulant. The air channels were clean from visible debris, which shows the permeability of the volatiles through the encapsulating polymeric material, or "overcoat" material.

Air channels were also fabricated via the process flow using method 300 described in FIG. 3 using a PPC:TTBPS-TPFPB formulation as the sacrificial composition. The PAG, TTBPS-TPFPB, was chosen because it thermally decomposes at a higher temperature than the DPI-TPFPB. A higher decomposition temperature PAG leaves intact the unexposed region of the sacrificial material, while the exposed area is selectively decomposed. The decomposition temperature of TTBPS-TPFPB was found to be 190° C. from the differential scanning calorimetry (DSC). Buried air-channels in AVATREL EPM encapsulant were fabricated using the process sequence described as method 300 of FIG. 3. A PPC (20 wt %):TTBPS-TPFPB (5 wt % of PPC) formulation was spin-coated onto a silicon wafer and soft-baked on a hotplate at 110° C., resulting in a thickness of 5.45 µm. The photosensitive PPC film was irradiated (1 J/cm²; 240 nm) through a clear-field mask having with a line/space pattern of 100-µm wide lines and 240-µm wide spaces. The AVATREL EPM encapsulant was then spin-coated and soft-baked at 80° C. for 5 minutes to remove any solvent from the encapsulating layer. The exposed area was then selectively decomposed by heating at 110° C. for 30 minutes in a tube furnace under nitrogen to form air-gaps.

Figure 12:
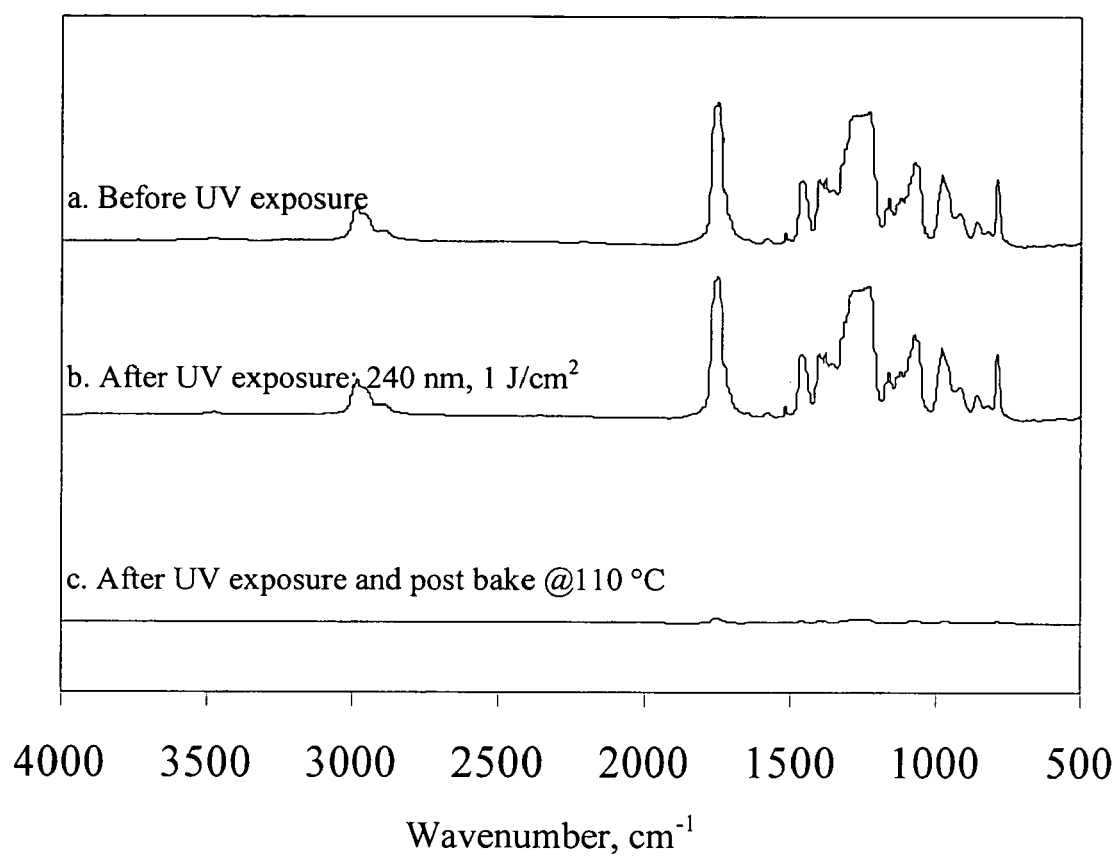
FIG. 12 is a graph of infrared (1R) spectra for a representative disclosed sacrificial composition during the various stages of a representative method of forming air channels.

FT-IR Analysis of the Decomposition of Representative Sacrificial Composition Film The acid catalyzed decomposition of PPC (12 wt %):DPI-TPFPB PAG (5 wt % of PPC) was studied by FT-IR. The sacrificial composition was spun onto a NaCl plate and soft-baked on a hotplate at 110° C. for 10 min. The thickness of the film was measured to be 1.45 µm. The Fourier Transform—Infrared (FT-IR) spectrum of the unexposed film was recorded as shown in FIG. 12(a). The film was then exposed to UV light (1 J/cm²; 240 nm) and scanned again (FIG. 12(b)). The film was post-exposure baked on a hotplate at 110° C. for 2 h (FIG. 12(c)). In FIG. 12(a), the absorptions at 2990 cm$^{-1}$, 1470 cm$^{-1}$ and 1250 cm$^{-1}$ were assigned to C—H stretches, C—H bending and C—C stretching of the PPC respectively. A strong absorption band at 1750 cm$^{-1}$ corresponds to C=O stretch of the PPC. On examining the UV-exposed PPC film (FIG. 12(b)), no specific transformation in the chemical structure has occurred, except that the photosensitive acid generator was activated during irradiation. The intensities of all peaks were nearly zero after the final bake at 110° C. (FIG. 12(c)). This is believed to be due to the decomposition of the sacrificial polymer PPC into volatile products.

Decomposition of Representative Sacrificial Composition Monitored by Mass Spectrometry Mass spectrometry (MS) using electron impact ionization was employed to detect the evolved species during the depolymerization and volatilization process for an exemplar sacrificial composition. Three representative samples were analyzed to determine the nature of the chemical species that were produced during degradation. In the first case, the PPC (12 wt %): DPI-TPFPB (5 wt % of PPC) formulation was spin-coated onto a silicon wafer, soft-baked on a hotplate at 110° C. for 10 minutes, then irradiated with 1 J/cm$^2$ UV irradiation at 240 nm. In the second case, the sample was prepared as above, but was not UV irradiated. In the third case, to study the volatiles evolved from the sacrificial polymer (here, PPC) without a photoacid generator, a sample was made from the solution that contained only PPC. This PPC film was not UV irradiated. The films were removed from the silicon and analyzed by gas chromatograph-mass spectrometer (GC-MS) to study the evolution of volatiles under different conditions. The samples were ramped at 5° C./min from 30 to 110° C. and held for 30 minutes, followed by a ramp at 15° C./min to 300° C. and held for 20 min.

Figure 13:
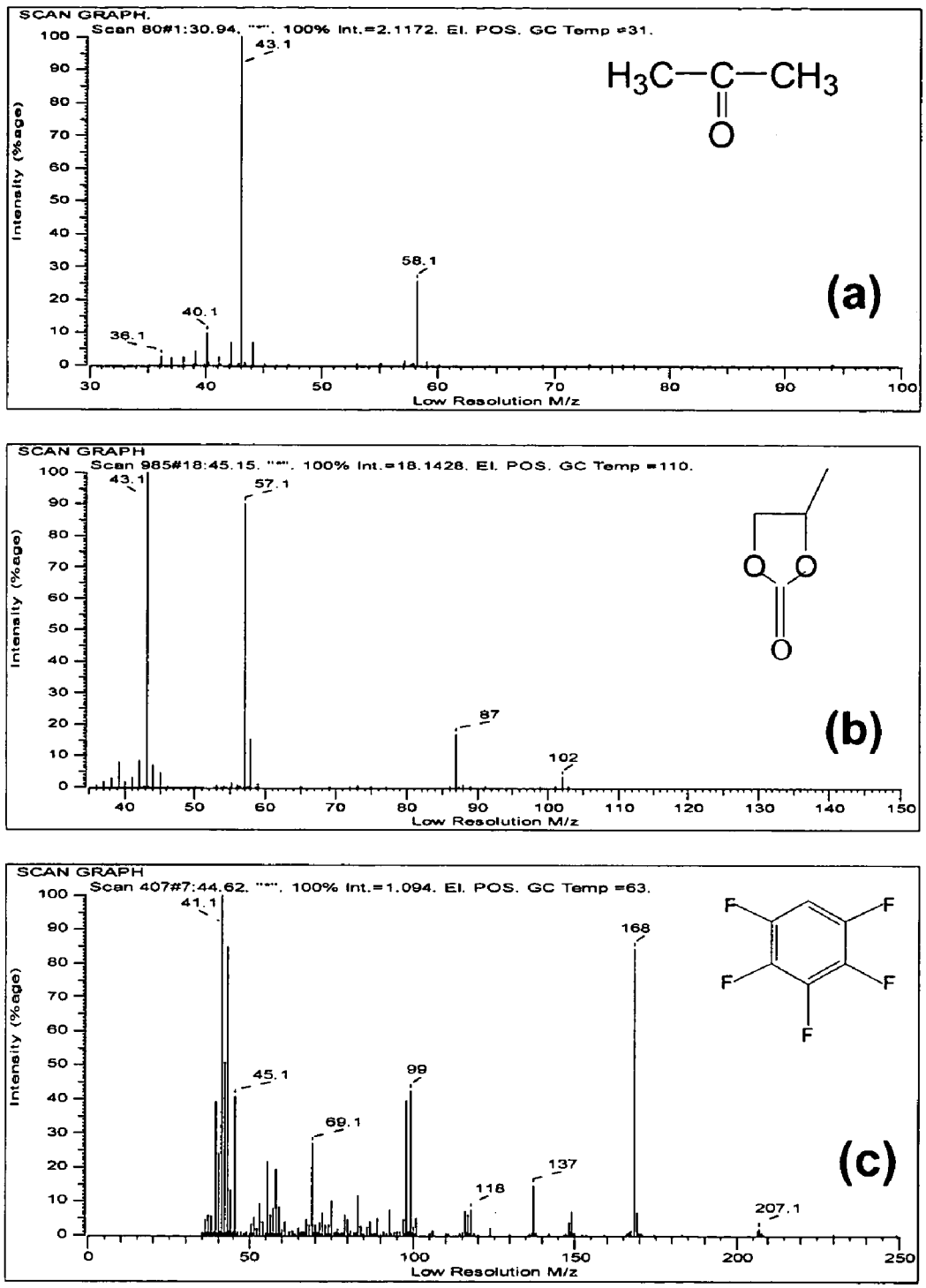
FIG. 13 illustrates mass spectrometry (MS) scans of a representative disclosed sacrificial composition after the composition has been exposed to ultraviolet (UV) radiation.

The mass spectrum data for the decomposition of PPC: DPI-TPFPB formulation with UV exposure shows the ion current for a mass-to-charge ratio (m/z) of 58 and 102 which correspond to acetone and propylene carbonate, respectively. Scans of the UV irradiated photosensitive polycarbonate sample are shown in FIGS. 13(a), (b) & (c). These scans at different intervals of time during the degradation process reveal the evolution of these two prominent species. FIG. 13(a) also shows other species at m/z 43.1, 40.1 and 36.1 which corresponds to the fragmentation products of acetone. The m/z 58 peak may also correspond to the formation of $CH_3CH_2CHO$. FIG. 13(b) shows other-high intensity volatiles corresponding to the molecular weights 43, 57, and 87, which are the fragmentation products of the propylene carbonate and may be assigned to ethylene oxide, propylene oxide, and ethylene carbonate, respectively. The mass spectrum at 63° C. is presented in FIG. 13(c). The high intensity peak at 168 m/z can be assigned to a decomposition fragment of the PAG. This matches the mass of pentafluorobenzene ($HC_6F_5$) which is the derivative fragment of the anion of the photoacid, tetrakis pentafluorophenyl)borate $[B(C_6F_5)_4]$. This was confirmed by pyrolysing the photoacid (dissolved in anisole) which exhibited a strong mass peak at 168 m/z at 67° C. Tetrakis(pentafluorophenyl)borate anion can decompose on heating to yield pentafluorobenzene and tri(pentaflurophenyl)borate. The reaction includes the volatiles of particular interest that evolved from the degradation of the polycarbonate formulation.

Figure 16:
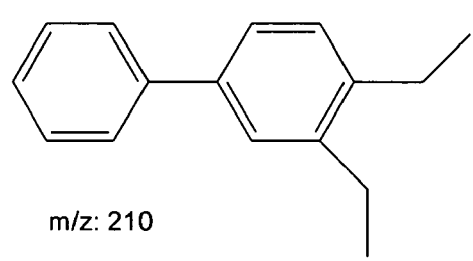
FIG. 16 depicts the chemical structures of other representative volatile compounds that evolve from the degradation of a representative sacrificial polymer formulation.
Figure 16:
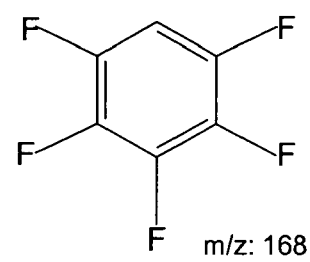
Figure 16:
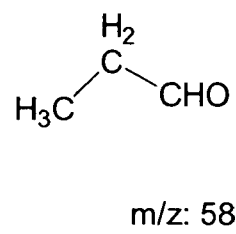
Figure 16:
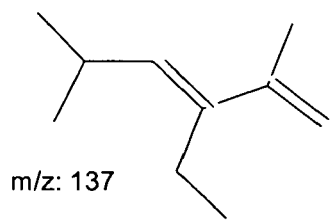
Figure 16:
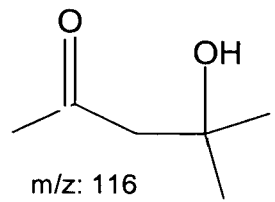
Figure 16:
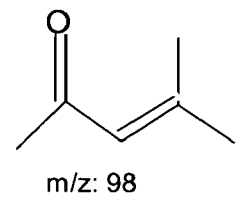

The suspected reaction products are shown in FIG. 16. The biphenyl derivative (m/z 210) and the pentafluorobenzene (m/z 168) resulted from the decomposition of the PAG, DPI-TPFPB. The other fragments having m/z values 137, 116, and 98 are the degradation products of the PPC. At higher temperatures, small amounts of higher molecular weight fragments were observed. These may have resulted from more complex fragmentation patterns.

Figure 14:
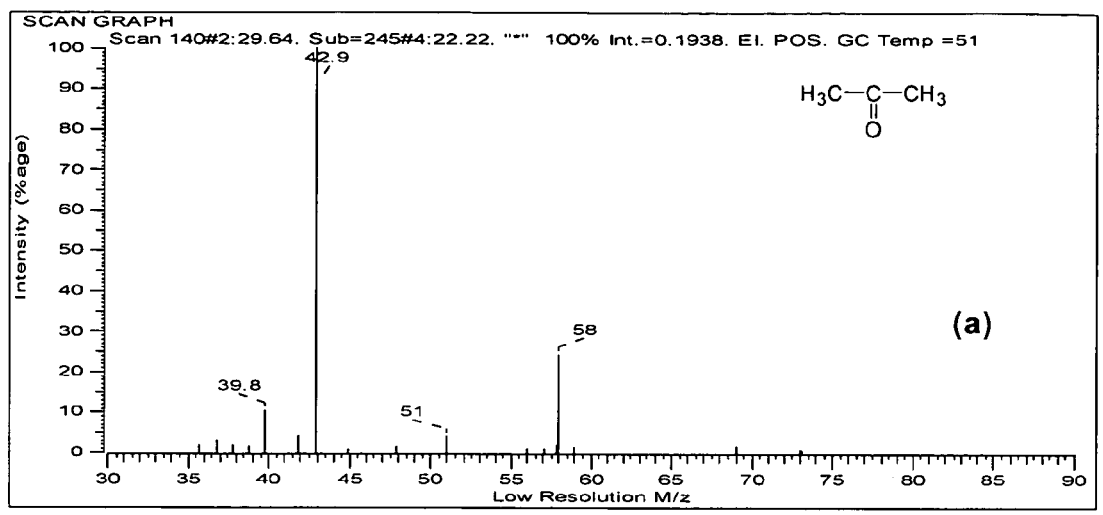
FIG. 14 illustrates MS scans of a representative disclosed sacrificial composition without exposure to UV radiation.
Figure 14:
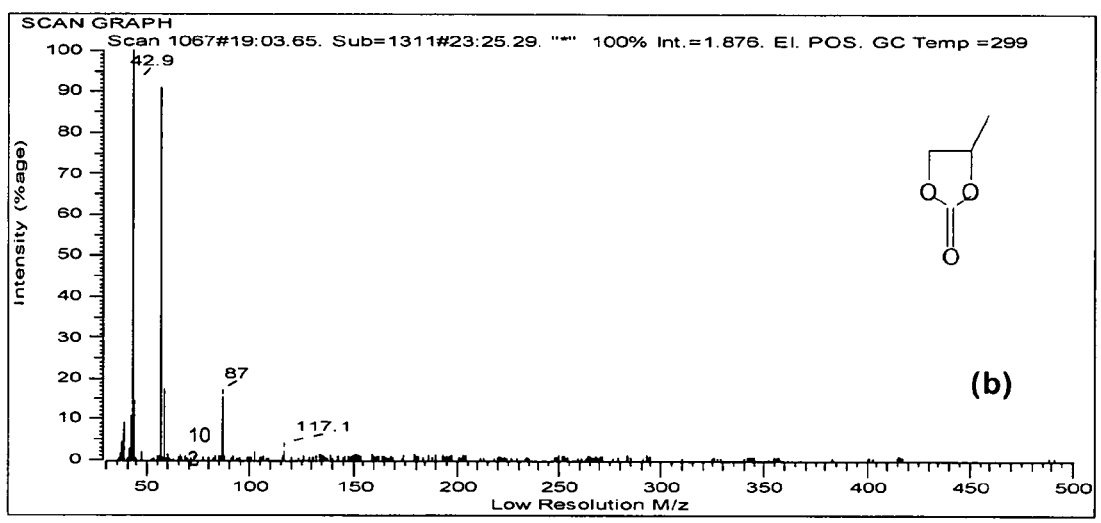
Figure 15:
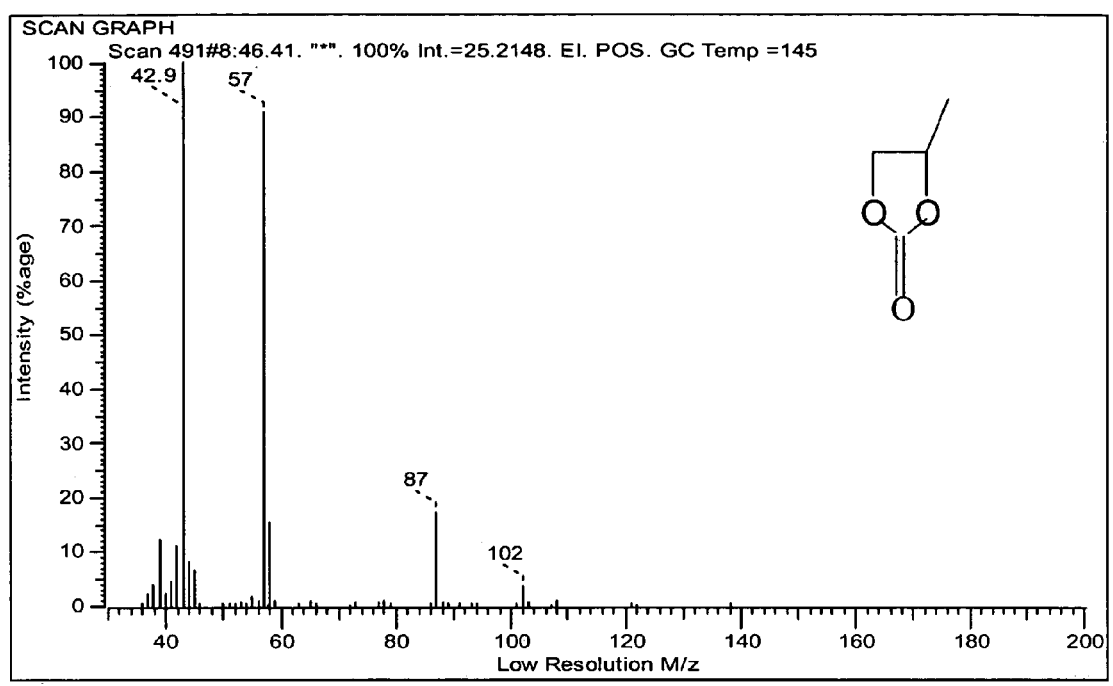
FIG. 15 illustrates selected MS scans for a representative sacrificial polymer, and its related fragmentation products.

The mass spectrum of the PPC formulation without UV exposure is shown in FIG. 14 and shows similar fragmentation patterns with that of PPC formulation with UV irradiation. Specifically, m/z peaks at 58 and 102 were observed, corresponding to acetone and propylene carbonate; respectively. The peak at m/z=58 may also correspond to $CH_3CH_2CHO$. This confirms that the acid catalyzed PPC decomposition is the same for photolytic or thermal activation of the PAG. The mass spectrum of the PPC without acid (and without UV irradiation) is shown in FIG. 15. The mass peak at m/z=102 at 145° C. can be assigned to propylene carbonate (as with the acid-catalyzed PPC). The other mass peaks at 87, 57, and 43 can be assigned to the propylene carbonate fragments: ethylene carbonate, propylene oxide, and ethylene oxide, respectively.

Mechanism for the Acid-Catalyzed Decomposition of Representative Sacrificial Polymer In one study, the MS data shows that the degradation of an exemplar sacrificial polymer, e.g., polypropylene carbonate, is initiated by the in-situ acid generated from the PAG, either photolytically or by thermal heating. Without being bound by any theory, it is believed that the degradation of PPC may take place in two stages: the scission reaction of the polymer chain followed by the unzipping reaction. Under pyrolysis at 180° C., it has been observed that polypropylene carbonate yielded propylene carbonate. Further, the propylene carbonate was fragmented as $CO_2$ and propylene oxide. The evolution of the two prominent species, acetone and propylene carbonate, from the degradation of polypropylene carbonate formulations (with and without UV irradiation) led to the following proposal of a dual-pathway degradation mechanism.

Figure 17:
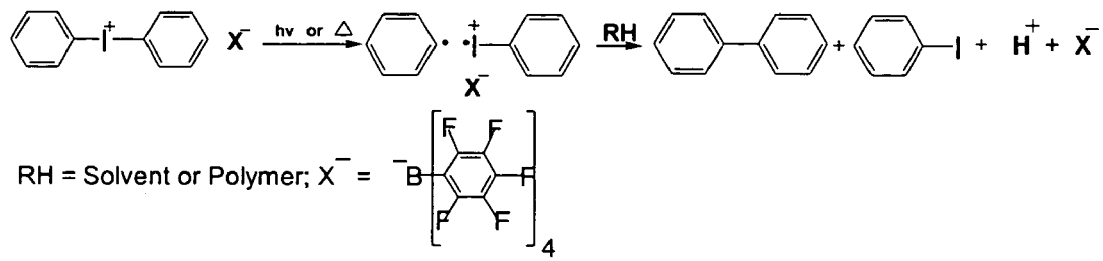
FIG. 17 depicts the chemical structures of a mechanism for the acid-catalyzed decomposition of a representative sacrificial polymer.
Figure 17:
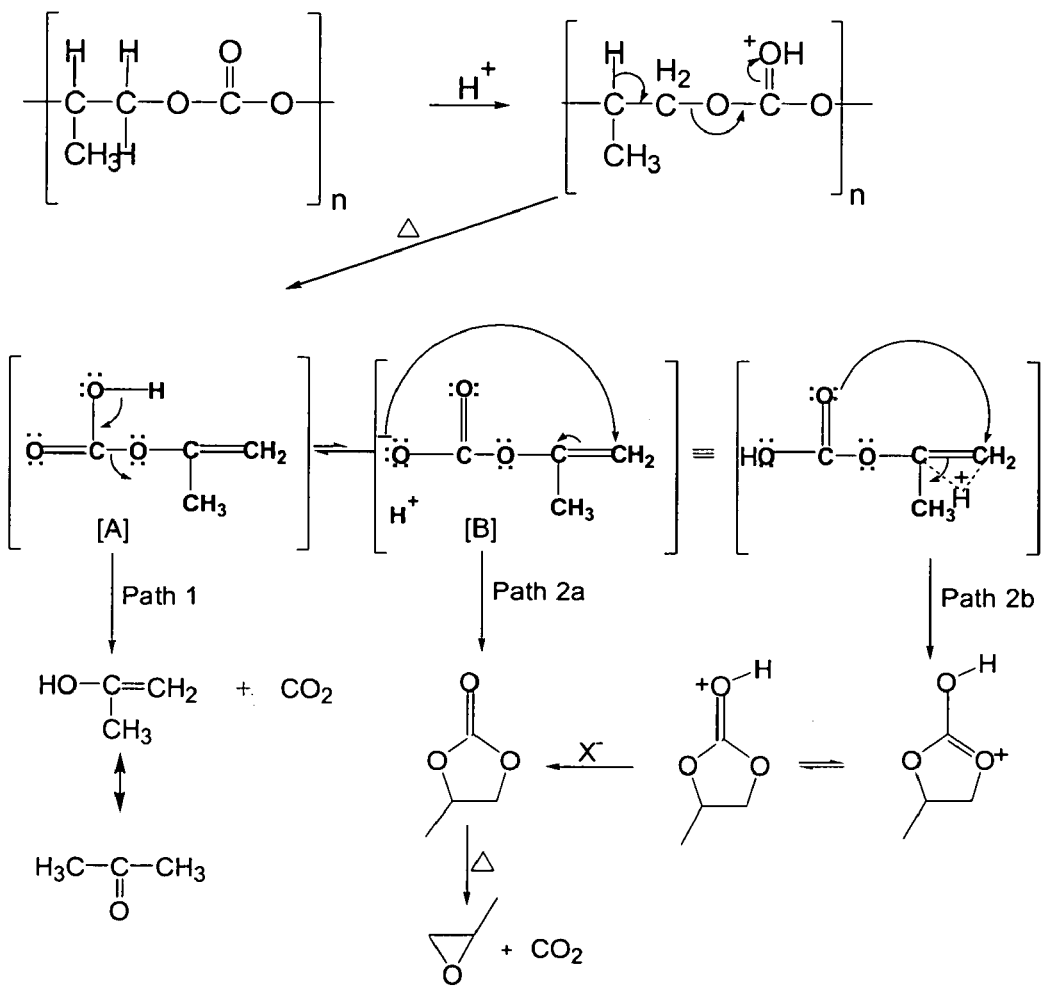

FIG. 17(a) describes the decomposition of the DPI-TPFPB PAG. On exposure to 240 nm UV irradiation, the cation part of the PAG decomposes to produce a proton that pairs with the complex anion to form a protic acid. In this mechanistic scheme, —RH is a donor of protons either from the solvent or the polymer itself. The decomposition of iodonium salts can be achieved by either UV exposure or by thermal breakdown of the cation/anion pair of the iodonium salt. Thus, the iodonium salt can act as a photo-acid generator as well as a latent thermal-acid generator. It has also been reported by that identical reaction products were obtained when onium salts were decomposed either photolytically or thermally. J. V. Crivello, et al., *J. Polym. Sci. Part A: Polym. Chem.*, vol. 21, p. 97, 1983.

FIG. 17(b) describes the proposed mechanism for the acid-catalyzed decomposition of polypropylene carbonate. During post-bake, the $H^+$ from the generated acid ($H^+X^-$) protonates the carbonyl oxygen and further rearranges the polar transition state leading to the formation of unstable tautomeric intermediates, [A] and [B]. From the mass spectrum we observed a strong mass peaks at 58 m/z and 102 m/z which was assigned for acetone and propylene carbonate, respectively. The acetone may be formed as the intermediate [A] (Path 1) rearranges and fragmenting as acetone and $CO_2$. The formation of propylene carbonate may be attributed to the intramolecular attack of the anion of the intermediate [B] (Path 2a) leading to the formation of the cyclic propylene carbonate. This further breaks down thermally into propylene oxide and $CO_2$. The mass peaks at 43 m/z and 57 m/z confirm the formation of ethylene oxide and propylene oxide, respectively.

Figure 18:
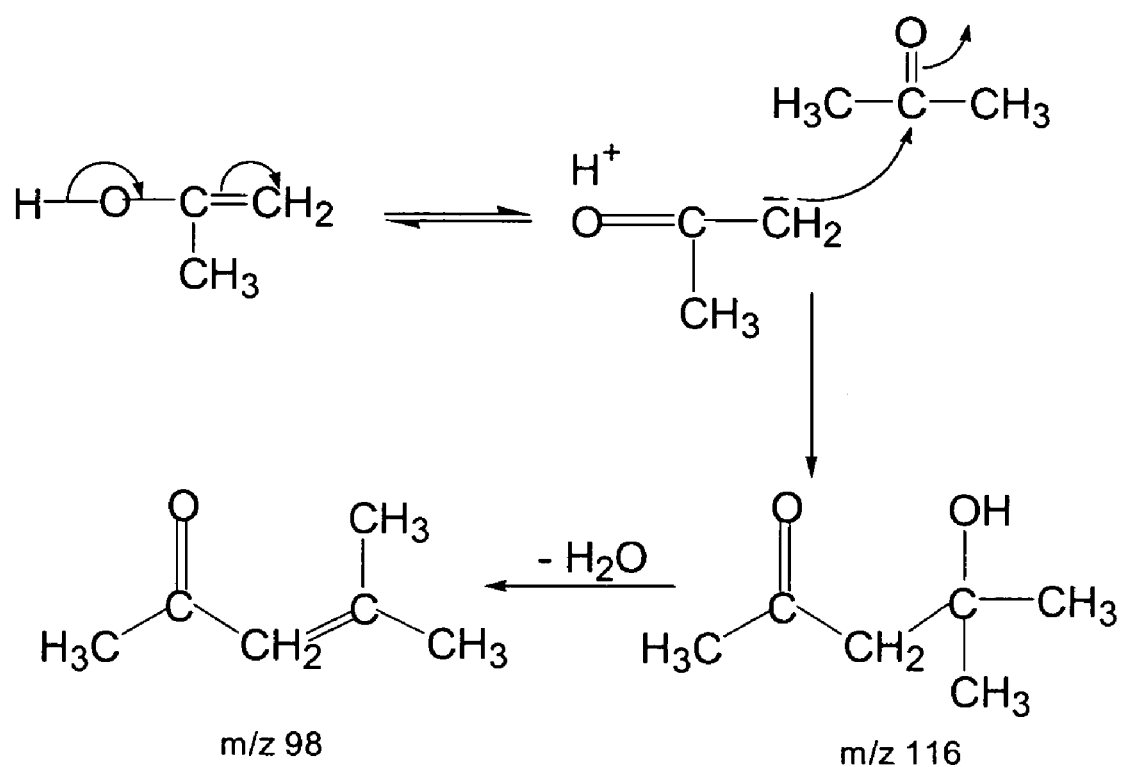
FIG. 18 depicts the chemical structures of a mechanism for the aldol condensation products evolved during the acid-catalyzed degradation reaction depicted in FIG. 17.

It is also reasonable to propose an alternative route for the formation of propylene carbonate in this highly acidic environment. The $H^+$ may activate the terminal double bond (Path 2b), leading to the formation of a cyclic transition state which on further rearrangement and abstraction of a proton by the counter ion $X^-$, may yield propylene carbonate. Further confirmation of the degradation via Path 1 is the formation of aldol condensation products. The mass peaks at 116 m/z and 98 m/z may be due to products that were produced due to the aldol condensation (FIG. 18).

CONCLUSION

The fabrication of air-gaps via acid-catalyzed degradation of a sacrificial polymer and a catalytic amount of a photoacid generator has been demonstrated. Based on the FT-IR and mass spectral studies, a detailed mechanism for the polypropylene carbonate and the DPI-TPFPB system has been proposed. The decomposition behavior of several different sacrificial compositions has also been studied using TGA. The low decomposition temperatures provide a mechanism to tailor the decomposition temperature through PAG concentration or sacrificial polymer structure. By providing a processing method to selectively decompose sacrificial composition areas through photoexposure, these materials are a promising candidate for various microelectronic, microfluidic, and MEMS fabrication applications. In particular, the insolubility of the disclosed sacrificial polymers in the solvents used for dielectric materials makes the combination especially valuable.

It should be emphasized that the above-described embodiments of this disclosure are merely possible examples of implementations, and are set forth for a clear understanding of the principles of this disclosure. Many variations and modifications may be made to the above-described embodiments of this disclosure without departing substantially from the spirit and principles of this disclosure. All such modifications and variations are intended to be included herein within the scope of this disclosure and protected by the following claims.

The invention claimed is:

1. A sacrificial composition of matter that decomposes to form air-regions, the sacrificial composition comprising:
a sacrificial polymer that undergoes acid-catalyzed decomposition, wherein the sacrificial polymer is chosen from polypropylene carbonate (PPC), polyethylene carbonate (PEC), polycyclohexane carbonate (PCC), polycyclohexanepropylene carbonate (PCPC), polynorbornene carbonate (PNC), a copolymer of polynorbornene and polynorbornene carbonate, and combinations thereof; and
a catalytic amount of a photoacid generator, wherein the photoacid generator is chosen from a nucleophilic halogenide, a complex metal halide anion, and combinations thereof.

2. The composition of matter of claim 1, wherein the composition decomposes at a temperature range from about 100 to 120 C.

3. The composition of matter of claim 1, wherein the composition decomposes at a temperature range from about 175 to 200 C.

4. The composition of matter of claim 1, wherein the composition decomposes at a temperature range from about 100 to 120 C. and leaves substantially no solid residue either from the polymer or the photoacid generator (PAG).

5. The composition of matter of claim 1, wherein the composition decomposes at a temperature range from about 100 to 120 C. after exposure to ultraviolet (UV) radiation.

6. The composition of matter of claim 1, wherein the composition acts as an adhesive.

7. The composition of matter of claim 1, wherein the composition is a positive tone sacrificial material.

8. The composition of matter of claim 1, wherein the photoacid generator is chosen from a diphenyliodononium salt, a triphenylsulfononium salt, a diphenyifluoronium salt, and combinations thereof.

9. The composition of matter of claim 1, wherein the photoacid generator is chosen from tetrakis(pentafluorophenyl)borate-4-methylphenyl [4-(1-methylethyl)phenyl] iodonium (DPI-TPFPB), tris(4-t-butylphenyl)sulfonium tetrakis-(pentafluorophenyl)borate (TTBPS-TPFPB), tris(4-t-butylphenyl)sulfonium hexafluorophosphate (TTBPS-HFP), triphenylsulfonium triflate (TPS-Tf), bis(4-tert-butylphenyl) iodonium triflate (DTBPI-Tf), triazine (TAZ-101), triphenylsulfonium hexafluoroantimonate (TPS-103), triphenylsulfonium bis(perfluoromethanesulfonyl) imide (TPS-N 1), di-(p-t-butyl) phenyliodonium bis(perfluoromethanesulfonyl) imide (DTBPI-N 1), triphenylsulfonium tris(perfluoromethanesulfonyl) methide (TPS-C1), di-(p-t-butylphenyl) iodonium, tris(perfluoromethanesulfonyl)methide (DTBPI-C1), and combinations thereof.

10. The composition of claim 1, wherein the sacrificial polymer is about 1 to 50% by weight percent of the composition, and wherein the photoacid generator is from about 0.5 to 5% by weight of the composition.

* * * * *

UNITED STATES PATENT AND TRADEMARK OFFICE
CERTIFICATE OF CORRECTION

PATENT NO. : 7,052,821 B2  
APPLICATION NO. : 10/699330  
DATED : May 30, 2006  
INVENTOR(S) : Kohl et al.

Page 1 of 1

It is certified that error appears in the above-identified patent and that said Letters Patent is hereby corrected as shown below:

On Title Page, See Item (74), Attorney, Agent, or Firm, "Thomas, Kayden, Horstemeyer & Risley LLP" should read -- The Webb Law Firm --

Column 15, Line 34 and Line 35, Claim 1, "polynorbomene carbonate (PNC), a copolymer of polynorbomene and polynorbomene carbonate" should read -- polynorbomene carbonate (PNC), a copolymer of polynorbornene and polynorbomene carbonate --

Column 15, Line 42, Claim 2, "100 to 120 C." should read -- 100 to 120°C. --

Column 16, Line 3 Claim 3, "175 to 200 C." should read -- 175 to 200°C. --

Column 16. Line 6, Claim 4, "100 to 120 C." should read -- 100 to 120°C. --

Column 16, Line 11, Claim 5, "100 to 120 C." should read -- 100 to 120°C. --

Column 16, Line 19, Claim 8, "a diphenyifluoronium salt" should read -- a diphenylfluoronium salt --

Signed and Sealed this

Twenty-first Day of November, 2006

JON W. DUDAS  
*Director of the United States Patent and Trademark Office*

UNITED STATES PATENT AND TRADEMARK OFFICE
CERTIFICATE OF CORRECTION

PATENT NO. : 7,052,821 B2
APPLICATION NO. : 10/699330
DATED : May 30, 2006
INVENTOR(S) : Kohl et al.

It is certified that error appears in the above-identified patent and that said Letters Patent is hereby corrected as shown below:

On Title Page, See Item (74), Attorney, Agent, or Firm, "Thomas, Kayden, Horstemeyer & Risley LLP" should read -- The Webb Law Firm --

Column 15, Line 34 and Line 35, Claim 1, "polynorbomene carbonate (PNC), a copolymer of polynorbomene and polynorbomene carbonate" should read -- polynorbornene carbonate (PNC), a copolymer of polynorbornene and polynorbornene carbonate --

Column 15, Line 42, Claim 2, "100 to 120 C." should read -- 100 to 120°C. --

Column 16, Line 3 Claim 3, "175 to 200 C." should read -- 175 to 200°C. --

Column 16. Line 6, Claim 4, "100 to 120 C." should read -- 100 to 120°C. --

Column 16, Line 11, Claim 5, "100 to 120 C." should read -- 100 to 120°C. --

Column 16, Line 19, Claim 8, "a diphenyifluoronium salt" should read -- a diphenylfluoronium salt --

This certificate supersedes Certificate of Correction issued November 21, 2006.

Signed and Sealed this

Twentieth Day of February, 2007

JON W. DUDAS
*Director of the United States Patent and Trademark Office*